(12) United States Patent
Kim et al.

(10) Patent No.: US 12,127,433 B2
(45) Date of Patent: Oct. 22, 2024

(54) DISPLAY DEVICE AND DRIVING METHOD THEREOF

(71) Applicant: Samsung Display Co., LTD., Yongin-si (KR)

(72) Inventors: Gun Hee Kim, Seoul (KR); Sang Ho Park, Hwaseong-si (KR); Joo Hee Jeon, Hwaseong-si (KR); Young-Cheol Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 702 days.

(21) Appl. No.: 17/266,496

(22) PCT Filed: May 22, 2019

(86) PCT No.: PCT/KR2019/006135
§ 371 (c)(1),
(2) Date: Feb. 5, 2021

(87) PCT Pub. No.: WO2020/032355
PCT Pub. Date: Feb. 13, 2020

(65) Prior Publication Data
US 2021/0305340 A1    Sep. 30, 2021

(30) Foreign Application Priority Data

Aug. 6, 2018    (KR) .................. 10-2018-0091273

(51) Int. Cl.
*H10K 59/121*     (2023.01)
*G09G 3/3291*     (2016.01)
(Continued)

(52) U.S. Cl.
CPC ....... *H10K 59/1213* (2023.02); *G09G 3/3291* (2013.01); *H01L 29/78696* (2013.01); *H10K 59/131* (2023.02)

(58) Field of Classification Search
CPC ......... H01L 29/42384; H01L 29/78645; H01L 29/78648; H01L 29/78696; H10K 50/00; H10K 59/1213; H10K 59/131
See application file for complete search history.

(56) References Cited

U.S. PATENT DOCUMENTS 9,343,484 B2    5/2016  Park et al.
2003/0122194 A1  7/2003  Takemura
(Continued)

FOREIGN PATENT DOCUMENTS

| JP | 2003-140185 A | 5/2003 |
| KR | 10-0163912 | 12/1998 |

(Continued)

OTHER PUBLICATIONS

International Search Report dated Aug. 30, 2019, for corresponding Application No. PCT/KR2019/006135, 4 pages.

*Primary Examiner* — Meiya Li
(74) *Attorney, Agent, or Firm* — Lewis Roca Rothgerber Christie LLP

(57) ABSTRACT

A display device includes: a substrate; and a transistor on the substrate. The transistor includes: a semiconductor layer; a gate electrode overlapping with the semiconductor layer; a first gate contact overlapping layer overlapping with a channel region, and in contact with the gate electrode, the channel region being a region where the gate electrode and the semiconductor layer are overlapped with each other; and a semiconductor contact overlapping layer overlapping with the channel region, and in contact with the semiconductor layer. The first gate contact overlapping layer and the semiconductor contact overlapping layer are spaced apart from each other by a gap within the channel region.

12 Claims, 18 Drawing Sheets

(51) Int. Cl.
    *H01L 29/786*     (2006.01)
    *H10K 59/131*     (2023.01)

(56)     References Cited

U.S. PATENT DOCUMENTS

| | | |
|---|---|---|
| 2015/0379923 A1 | 12/2015 | Lee et al. |
| 2016/0149052 A1 | 5/2016 | Ahn et al. |
| 2017/0170251 A1 | 6/2017 | Moon et al. |
| 2018/0013007 A1 | 1/2018 | Sato |
| 2018/0053836 A1* | 2/2018 | Jang .................... H10K 10/462 |
| 2018/0069069 A1 | 3/2018 | Ebisuno et al. |

FOREIGN PATENT DOCUMENTS

| | | |
|---|---|---|
| KR | 10-2015-0075512 A | 7/2015 |
| KR | 10-2015-0142205 A | 12/2015 |
| KR | 10-2016-0027332 A | 3/2016 |
| KR | 10-2016-0062831 A | 6/2016 |
| KR | 10-2017-0070937 A | 6/2017 |
| KR | 10-2017-0119023 A | 10/2017 |
| KR | 10-2018-0026602 A | 3/2018 |

\* cited by examiner

DISPLAY DEVICE AND DRIVING METHOD THEREOF

CROSS-REFERENCE TO RELATED APPLICATIONS

This application is a U.S. National Phase Patent Application of International Patent Application Number PCT/KR2019/006135, filed on May 22, 2019, which claims priority to Korean Patent Application Number 10-2018-0091273, filed on Aug. 6, 2018, the entire content of all of which is incorporated herein by reference.

BACKGROUND

1. Field

Aspects of embodiments of the present disclosure relate to a display device and a driving method thereof. More particularly, aspects of embodiments of the present disclosure relate to a display device including a transistor having improved characteristics, and a driving method thereof.

2. Description of Related Art

A display device is a device for displaying an image, and recently, an organic light emitting diode display has attracted attention.

The organic light emitting diode display has a self-emission characteristic, and unlike a liquid crystal display, does not require a separate light source, so that the thickness and weight thereof may be reduced. In addition, the organic light emitting diode display exhibits high quality characteristics such as low power consumption, high luminance, and high reaction speed.

In general, the organic light emitting diode display includes a substrate, a plurality of transistors disposed on the substrate, and an organic light emitting element connected to the transistor. The transistor is a switching element, and is a basic configuration of the display device.

A transistor having characteristics, for example, such as a large data range and a large current flowing therethrough in a turned-on state, may be desired for improving display quality of the display device.

The above information disclosed in this Background section is for enhancement of understanding of the background of the present disclosure, and therefore, it may contain information that does not constitute prior art.

SUMMARY

Embodiments of the present disclosure are directed to a display device including a transistor having desired characteristics, for example, such as a large data range and a large current flowing therethrough in a turned-on state thereof, and a driving method thereof.

According to an embodiment of the present disclosure, a display device includes: a substrate; and a transistor positioned on the substrate. The transistor includes: a semiconductor layer; a gate electrode overlapping with the semiconductor layer; a first gate contact overlapping layer overlapping with a channel region where the gate electrode and the semiconductor layer are overlapped with each other, and in contact with the gate electrode, and a semiconductor contact overlapping layer overlapping with the channel region, and in contact with the semiconductor layer. The first gate contact overlapping layer and the semiconductor contact overlapping layer are physically separated from each other by a gap within the channel region.

The transistor may further include a second gate contact overlapping layer overlapping with the channel region, and in contact with the gate electrode, and the semiconductor contact overlapping layer may be disposed between the first gate contact overlapping layer and the second gate contact overlapping layer on a plane.

On a plane, a width of the entire region including the first gate contact overlapping layer, the semiconductor contact overlapping layer, the second gate contact overlapping layer, and the gap may be larger than a width of the channel region.

On a plane, a width of the entire region including the first gate contact overlapping layer, the semiconductor contact overlapping layer, the second gate contact overlapping layer, and the gap may be smaller than a width of the channel region.

The transistor may further include a floating overlapping layer overlapping with the channel region, and insulated from the semiconductor layer and the gate electrode without being connected.

The semiconductor contact overlapping layer may include: a first overlapping part overlapping with the channel region; a second overlapping part overlapping with the channel region; a contact portion in contact with the semiconductor layer without overlapping with the gate electrode; and an extending part connecting the first overlapping part, the second overlapping part, and the contact portion to each other.

The first gate contact overlapping layer may be disposed between the first overlapping part and the second overlapping part.

On a plane, a width of the entire region including the first gate contact overlapping layer, the first overlapping part, the second overlapping part, and the gap may be larger than a width of the channel region.

On a plane, a width of the entire region including the first gate contact overlapping layer, the first overlapping part, the second overlapping part, and the gap may be smaller than a width of the channel region.

The transistor may further include a floating overlapping layer overlapping with the channel region, and insulated from the semiconductor layer and the gate electrode without being connected.

The width of the first gate contact overlapping layer may be the same as the width of the semiconductor contact overlapping layer.

The width of the first gate contact overlapping layer and the width of the semiconductor contact overlapping layer may be different from each other.

According to an embodiment of the present disclosure, a display device includes a plurality of pixels, each of the plurality of pixels includes: a light emitting diode; and a driving transistor for controlling a current amount flowing from a first power source voltage to the light emitting diode. The driving transistor includes: a gate electrode connected to a first node; a first electrode to which the first power source voltage is applied; a second electrode electrically connected to the light emitting diode; a gate contact overlapping layer overlapping with the channel region of the driving transistor, and connected to the gate electrode; and a semiconductor contact overlapping layer overlapping with the channel region, and connected to the first electrode. The gate contact overlapping layer and the semiconductor contact overlapping layer are physically separated from each other by a gap.

Each of the plurality of pixels may further include a switching transistor connected between the data line and the driving transistor, and the switching transistor may include: a gate electrode connected to the first gate line; and a gate contact overlapping layer overlapping with the channel region of the switching transistor, and connected to the gate electrode of the switching transistor.

Each of the plurality of pixels may further include a compensation transistor connected between the second electrode and the gate electrode of the driving transistor, and the compensation transistor may include: a gate electrode connected to the first gate line; and a gate contact overlapping layer overlapping with the channel region of the compensation transistor, and connected to the gate electrode of the compensation transistor.

Each of the plurality of pixels may further include an initialization transistor for applying an initialization voltage to the gate electrode of the driving transistor, and the initialization transistor may include: a gate electrode connected to the second gate line; and a gate contact overlapping layer overlapping with the channel region of the initialization transistor, and connected to the gate electrode of the initialization transistor.

According to an embodiment of the present disclosure, a driving method of a display device is provided. The display device includes a driving transistor for controlling a current amount flowing from a first power source voltage to a light emitting diode, a switching transistor for transmitting a data voltage applied to a data line to the driving transistor according to a first gate signal applied to the first gate line, a compensation transistor for diode-connecting the driving transistor according to the first gate signal, and an initialization transistor for applying an initialization voltage to the gate electrode of the driving transistor according to a second gate signal applied to a second gate line. The method includes: applying the first power source voltage to the first electrode of the driving transistor; flowing a current from the first power source voltage to the light emitting diode by corresponding to a voltage of a first node to which the gate electrode of the driving transistor is connected; applying the first power source voltage to a semiconductor contact overlapping layer overlapping with the channel region of the driving transistor, and connected to the first electrode of the driving transistor; and applying the voltage of the first node to a gate contact overlapping layer overlapping with the channel region of the driving transistor, and connected to the gate electrode of the driving transistor.

The method may further include: applying the first gate signal to the gate electrode of the switching transistor as the gate-on voltage to turn on the switching transistor; and applying the first gate signal to a gate contact overlapping layer overlapping with the channel region of the switching transistor, and connected to the gate electrode of the switching transistor.

The method may further include: applying the first gate signal to the gate electrode of the compensation transistor as a gate-on voltage to turn on the compensation transistor; and applying the first gate signal to a gate contact overlapping layer overlapping with the channel region of the compensation transistor, and connected to the gate electrode of the compensation transistor.

The method may further include: applying the second gate signal to the gate electrode of the initialization transistor as a gate-on voltage to turn on the initialization transistor; and applying the second gate signal to a gate contact overlapping layer overlapping with the channel region of the initialization transistor, and connected to the gate electrode of the initialization transistor.

According to one or more embodiments of the present disclosure, the data range of the transistor used in the display device and the current flowing in the transistor in a turned-on state may be increased, and accordingly, the display quality of the display device may be improved.

According to one or more embodiments of the present disclosure, by increasing the data range of the driving transistor, more various gray images may be displayed. By increasing the current flowing through the transistor that functions as a switching element, it may be possible to improve the charging efficiency of a voltage thereof, and enable high-speed driving of the display device.

BRIEF DESCRIPTION OF THE DRAWINGS

The above and other aspects and features of the present disclosure will become more apparent to those skilled in the art from the following detailed description of the example embodiments with reference to the accompanying drawings.

DETAILED DESCRIPTION

Figure 1:
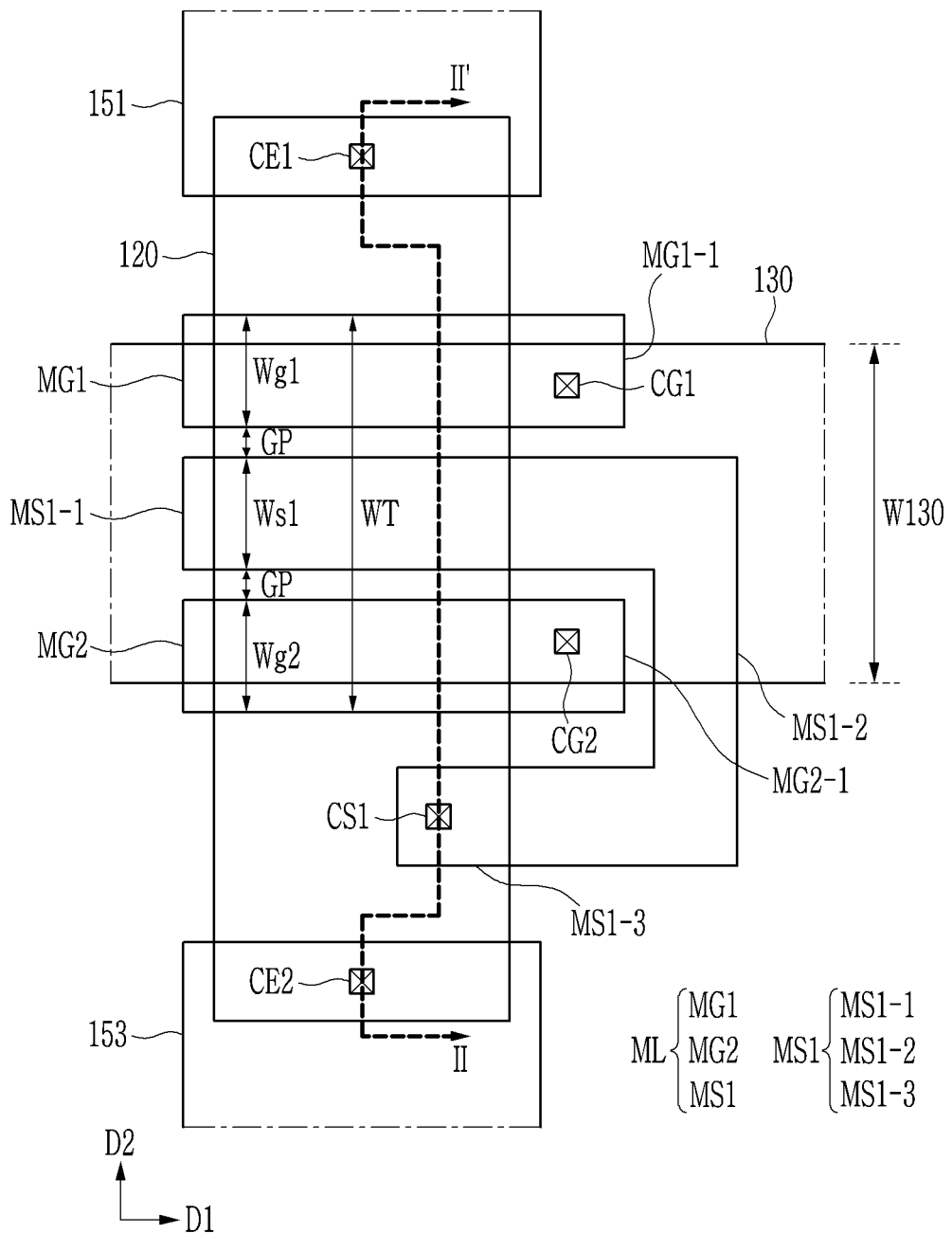
FIG. 1 is a top plan view showing a transistor according to an embodiment of the present disclosure.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. In addition, the thicknesses of layers, films, panels, regions, and the like may be exaggerated for clarity. For example, in the drawings, for better understanding and ease of illustration, the thicknesses of some layers and areas are exaggerated.

It will be understood that when an element or layer is referred to as being "on," "connected to," or "coupled to" another element or layer, it can be directly on, connected to, or coupled to the other element or layer, or one or more intervening elements or layers may be present. In contrast, when an element or layer is referred to as being "directly on," "directly connected to," or "directly coupled to" another element or layer, there are no intervening elements or layers present. Further, the terms "on" or "above" may refer to being positioned on or below the object portion, and does not necessarily refer to being positioned on the upper side of the object portion based on a gravitational direction.

Further, as used in the specification, the phrase "in a plan view" refers to a view of an object portion from above, and the phrase "in a cross-sectional view" refers to a view of the object portion from the side when a cross-section is taken by vertically cutting the object portion.

A transistor included in a display device according to an embodiment of the present disclosure is described in more detail hereinafter with reference to FIG. 1 and FIG. 2.

FIG. 1 is a top plan view showing a transistor according to an embodiment of the present disclosure. FIG. 2 is a cross-sectional view taken along the line II-II' of FIG. 1.

Figure 2:
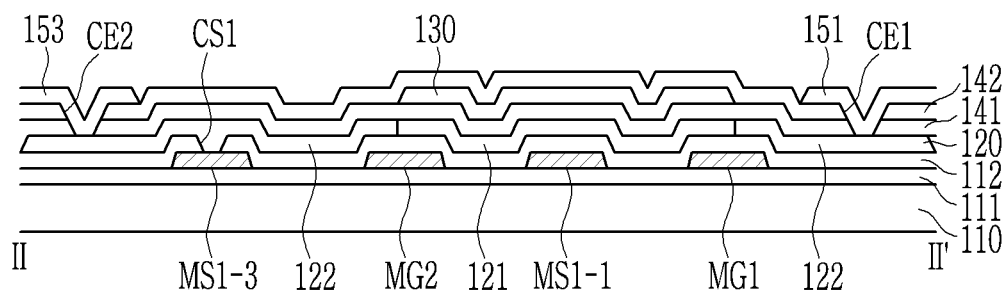
FIG. 2 is a cross-sectional view taken along the line II-II' of FIG. 1.

Referring to FIG. 1 and FIG. 2, the display device includes a plurality of transistors positioned on a substrate 110. Each of the plurality of transistors includes an overlapping layer ML, a semiconductor layer 120, a gate electrode 130, a first electrode 151, and a second electrode 153.

The substrate 110 may include a suitable material, for example, such as glass, plastic, or polyimide (PI). A barrier layer 111 is positioned on the substrate 110, and the overlapping layer ML including (e.g., made of) a metal having a suitable conductivity, or a semiconductor material having a conductive characteristic that is equivalent to the metal, is positioned on the barrier layer 111.

The overlapping layer ML includes gate contact overlapping layers MG1 and MG2, and a semiconductor contact overlapping layer MS1. The gate contact overlapping layers MG1 and MG2 may include a first gate contact overlapping layer MG1 that partially overlaps with the semiconductor layer 120 and is in contact with the gate electrode 130 through a first gate contact hole CG1, and a second gate contact overlapping layer MG2 that partially overlaps with the semiconductor layer 120 and is in contact with the gate electrode 130 through a second gate contact hole CG2.

As shown in FIG. 1, the gate electrode 130 extends in a first direction D1, and the semiconductor layer 120 extends in a second direction D2, thereby partially overlapping with the gate electrode 130. The second direction D2 may intersect (e.g., may cross) the first direction D1. The second direction D2 may be orthogonal to or substantially orthogonal to the first direction D1. For example, the first direction D1 may be a row direction, and the second direction D2 may be a column direction. However, the arrangement direction and the arrangement shape of the transistor may be variously modified as needed or desired according to an embodiment, and the first direction D1 and the second direction D2 may not be orthogonal to each other, and/or may not correspond to the row direction and the column direction. The overlapping portion of the semiconductor layer 120 and the gate electrode 130 may be the channel region of the transistor. The channel region of the transistor corresponds to a channel part 121 of the semiconductor layer 120, and the channel region of the transistor may be referred to as the channel region of the semiconductor layer 120.

The first gate contact overlapping layer MG1 extends in the first direction D1 along one side of the gate electrode 130 to overlap with the channel region. The first gate contact overlapping layer MG1 includes a first extending part MG1-1 that extends further in the first direction D1 than the semiconductor layer 120, and that does not overlap with the semiconductor layer 120 but overlaps with the gate electrode 130. The first gate contact hole CG1 is positioned at a position overlapping with the first extending part MG1-1, and the first gate contact overlapping layer MG1 may be directly connected to the gate electrode 130 though the first gate contact hole CG1.

The second gate contact overlapping layer MG2 extends in the first direction D1 along another side (e.g., an opposite side) of the gate electrode 130 to overlap with the channel region. The second gate contact overlapping layer MG2 includes a second extending part MG2-1 that extends further in the first direction D1 than the semiconductor layer 120, and that does not overlap with the semiconductor layer 120 but overlaps with the gate electrode 130. The second gate contact hole CG2 is positioned at a position overlapping with the second extending part MG2-1, and the second gate contact overlapping layer MG2 may be directly connected to the gate electrode 130 through the second gate contact hole CG2.

The semiconductor contact overlapping layer MS1 includes a first overlapping part MS1-1, an extending part MS1-2, and a contact part MS1-3. The first overlapping part MS1-1 extends to be parallel to or substantially parallel to the first gate contact overlapping layer MG1 and the second gate contact overlapping layer MG2 on a plane (e.g., in a plan view or in a view from a direction that is perpendicular or substantially perpendicular to a top surface the relevant element or layer, for example, such as the top surface of the transistor), and may overlap with the semiconductor layer 120 and the gate electrode 130. The first overlapping part MS1-1 overlaps with the channel region of the semiconductor layer 120. The first overlapping part MS1-1 may be positioned between the first gate contact overlapping layer MG1 and the second gate contact overlapping layer MG2 on a plane. The contact part MS1-3 does not overlap with the gate electrode 130, but overlaps with the semiconductor layer 120. A semiconductor contact hole CS1 is positioned at (e.g., in or on) the position overlapping with the contact part MS1-3, and the contact part MS1-3 may be in contact with the semiconductor layer 120 through the semiconductor contact hole CS1. The extending part MS1-2 has a structure that connects the first overlapping part MS1-1 and the contact part MS1-3 to each other. The extending part MS1-2 may not overlap with the semiconductor layer 120.

On a plane (e.g., in a plan view), the first gate contact overlapping layer MG1 and the first overlapping part MS1-1 of the semiconductor contact overlapping layer MS1 are disposed to be spaced apart from each other by a gap GP. The first gate contact overlapping layer MG1 and the first overlapping part MS1-1 of the semiconductor contact overlapping layer MS1 are physically separated (e.g., are spaced apart) from each other by the gap GP within the channel region. On a plane (e.g., in a plan view), the second gate contact overlapping layer MG2 and the first overlapping part MS1-1 of the semiconductor contact overlapping layer MS1 are spaced apart from each other by a gap GP. The second gate contact overlapping layer MG2 and the first overlapping part MS1-1 of the semiconductor contact overlapping layer MS1 are physically separated (e.g., are spaced apart) from each other by the gap GP within the channel region.

The first gate contact overlapping layer MG1, the second gate contact overlapping layer MG2, and the first overlapping part MS1-1 of the semiconductor contact overlapping layer MS1 overlap with the channel region of the semiconductor layer 120. The overlapping layer ML does not overlap with the channel region of the semiconductor layer 120 at (e.g., in or on) the gap GP. In other words, the gap GP is a region at (e.g., in or on) which the overlapping layer ML does not overlap with the channel region of the semiconductor layer 120.

On a plane (e.g., in a plan view), a width Wg1 of the first gate contact overlapping layer MG1, a width Wg2 of the second gate contact overlapping layer MG2, and a width Ws1 of the first overlapping part MS1-1 of the semiconductor contact overlapping layer MS1 may be the same or substantially the same as (e.g., may be equal to or substantially equal to) each other. Also, on a plane (e.g., in a plan view), a width WT of the entire region including the first gate contact overlapping layer MG1, the second gate contact overlapping layer MG2, the first overlapping part MS1-1 of the semiconductor contact overlapping layer MS1, and a plurality of the gaps GP may be larger than a width W130 of the overlapping channel region of the semiconductor layer 120 and the gate electrode 130. Each of the plurality of gaps GP may have a size of about 0.1 μm to 10 μm.

Here, the widths Wg1, Wg2, Ws1, WT, and W130 may be a length of the relevant layer in the second direction D2 crossing the first direction D1 in which the first gate contact overlapping layer MG1, the second gate contact overlapping layer MG2, the first overlapping part MS1-1 of the semiconductor contact overlapping layer MS1, and the gate electrode 130 extend.

Referring to FIG. 2, a buffer layer 112 is disposed on the overlapping layer ML. A semiconductor contact hole CS1 is formed in the buffer layer 112. A part of the contact part MS1-3 of the semiconductor contact overlapping layer MS1 may be exposed through the semiconductor contact hole CS1. The barrier layer 111 and the buffer layer 112 may include one or more suitable inorganic insulating materials, for example, such as silicon oxide, silicon nitride, and/or aluminum oxide. In addition, the barrier layer 111 and the buffer layer 112 may include one or more suitable organic insulating materials, for example, such as polyimide and/or polyacryl (added epoxy). The semiconductor layer 120 is positioned on the buffer layer 112. The semiconductor layer 120 includes a channel part 121, and a doping part 122 positioned on opposite sides (e.g., both sides) of the channel part 121. The channel part 121 may correspond to the channel region of the transistor, and the doping part 122 may correspond to the source region and the drain region of the transistor. Any suitable one doping part 122 of the semiconductor layer 120 may be connected to the contact part MS1-3 of the semiconductor contact overlapping layer MS1 through the semiconductor contact hole CS1. A first gate insulating layer 141 is positioned on the semiconductor layer 120, and the gate electrode 130 is positioned on the first gate insulating layer 141. The gate electrode 130 overlaps with the channel region of the semiconductor layer 120.

A first gate contact hole CG1 and a second gate contact hole CG2 (e.g., see FIG. 1) are formed in the buffer layer 112 and the first gate insulating layer 141. A part of the first gate overlapping layer MG1 is exposed by the first gate contact hole CG1. The gate electrode 130 overlaps with the first gate contact hole CG1, and may be connected to the first gate contact overlapping layer MG1 through the first gate contact hole CG1. A part of the second gate contact overlapping layer MG2 is exposed by the second gate contact hole CG2. The gate electrode 130 may overlap with the second gate contact hole CG2, and may be connected to the second gate contact overlapping layer MG2 through the second gate contact hole CG2.

A second gate insulating layer 142 may be positioned on the gate electrode 130. The first electrode 151 and the second electrode 153 may be positioned on the second gate insulating layer 142. The first electrode 151 may overlap with one doping part 122 of the semiconductor layer 120, and may be connected to the one doping part 122 of the semiconductor layer 120 through the first electrode contact hole CE1 formed in the first gate insulating layer 141 and the second gate insulating layer 142. The second electrode 153 may overlap with another doping part 122 of the semiconductor layer 120, and may be connected to the other doping part 122 of the semiconductor layer 120 through the second electrode contact hole CE2 formed in the first gate insulating layer 141 and the second gate insulating layer 142.

Depending on the direction in which a voltage or current is applied, one of the first electrode 151 and the second electrode 153 may be the source electrode of the transistor, and the other thereof may be the drain electrode. In other words, the semiconductor contact overlapping layer MS1 may be connected to the source electrode or the drain electrode of the transistor.

As described above, the overlapping layer ML includes two or more separated (e.g., spaced apart) structures within the channel region of the semiconductor layer 120, and the channel region may include a region (e.g., the gap GP) that does not overlap with the overlapping layer ML. A part of the overlapping layers ML (e.g., the gate contact overlapping layers MG1 and MG2) may be connected to the gate electrode 130 of the transistor, and another part thereof (e.g., the semiconductor contact overlapping layer MS1) may be connected to the source electrode or the drain electrode of the transistor. According to this configuration, the data range of the transistor may increase, and the current that may flow while the transistor is turned on may increase. This is described in more detail below.

Hereinafter, the transistor in which some configurations shown in FIG. 1 are modified according to an embodiment is described with reference to FIG. 3.

Figure 3:
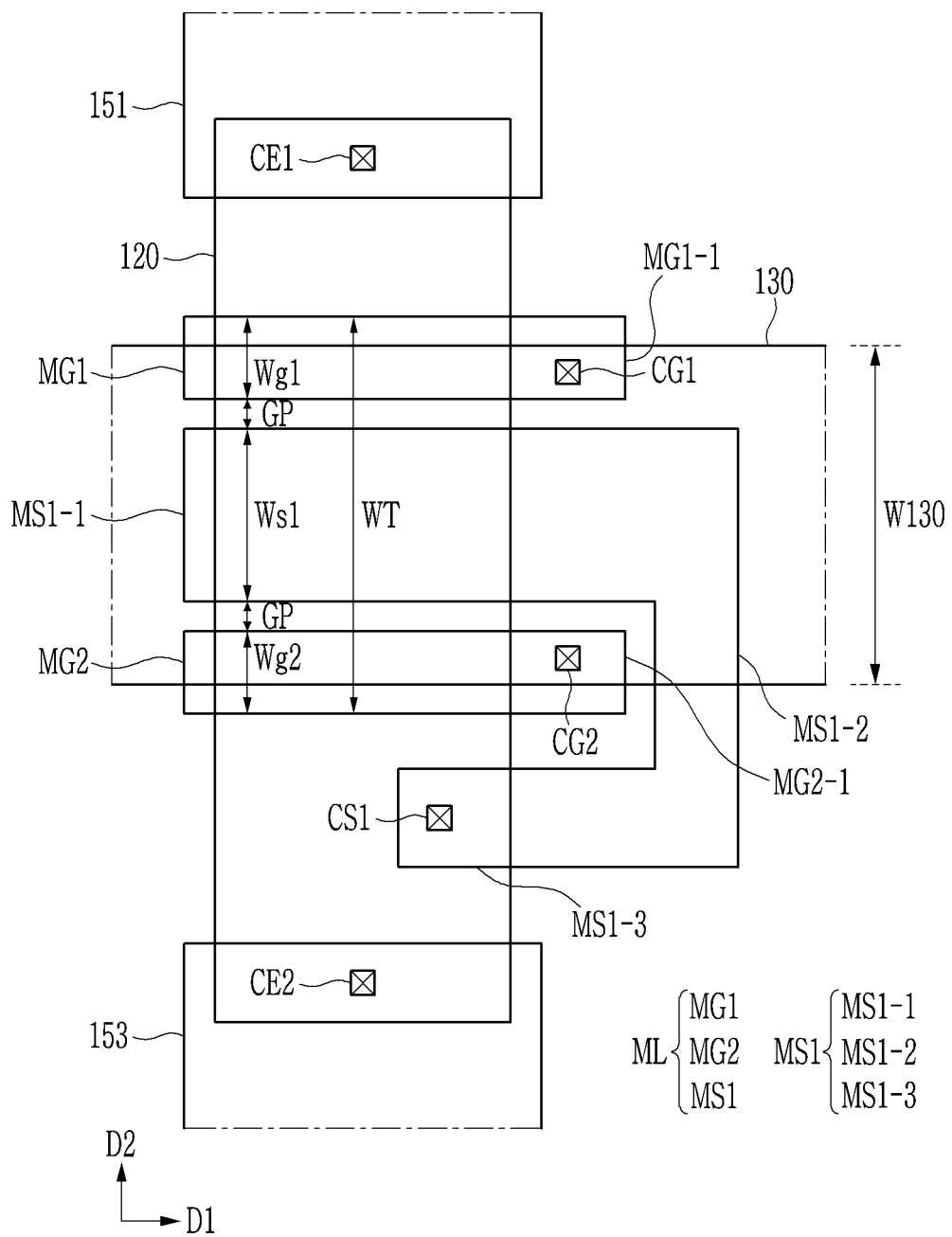
FIG. 3 is a top plan view showing a transistor of an embodiment in which some configurations shown in FIG. 1 are modified.

FIG. 3 is a top plan view showing a transistor of an embodiment in which some configurations shown in FIG. 1 are modified. Thus, the differences between the embodiment of FIG. 3 compared with the embodiments of FIG. 1 and FIG. 2 described above are mainly described hereinafter, and redundant description therebetween may not be repeated.

Referring to FIG. 3, the width Ws1 of the first overlapping part MS1-1 of the semiconductor contact overlapping layer MS1 may be larger than the width Wg1 of the first gate contact overlapping layer MG1. Further, the width Ws1 of the first overlapping part MS1-1 of the semiconductor contact overlapping layer MS1 may be larger than the width Wg2 of the second gate contact overlapping layer MG2. In other words, on a plane (e.g., in a plan view), the width Ws1 of the first overlapping part MS1-1 of the semiconductor contact overlapping layer MS1 may be different from the width Wg1 of the first gate contact overlapping layer MG1 and the width Wg2 of the second gate contact overlapping layer MG2. The width Wg1 of the first gate contact overlapping layer MG1 and the width Wg2 of the second gate contact overlapping layer MG2 may be the same or substantially the same as each other, or may be different from each other. Even in this case, on a plane (e.g., in a plan view), the width WT of the entire region including the first gate contact overlapping layer MG1, the second gate contact overlapping layer MG2, the first overlapping part MS1-1, and a plurality of gaps GP of the semiconductor contact overlapping layer MS1 may be larger than the width W130 of the channel region of the semiconductor layer 120.

On the other hand, in contrast to the example of FIG. 3, in some embodiments, the width Ws1 of the first overlapping part MS1-1 of the semiconductor contact overlapping layer MS1 may be smaller than the width Wg1 of the first gate contact overlapping layer MG1, and may be smaller than the width Wg2 of the second gate contact overlapping layer MG2. In this example, on a plane (e.g., in a plan view), the width WT of the entire region including the first gate contact overlapping layer MG1, the second gate contact overlapping layer MG2, the first overlapping part MS1-1 of the semiconductor contact overlapping layer MS1, and a plurality of gaps GP may still be larger than the width W130 of the channel region of the semiconductor layer 120.

Other than the above-described differences, the features of the embodiments described with reference to FIG. 1 and FIG. 2 may be applied to all of the embodiments described with reference to FIG. 3, and thus, redundant description between the embodiments may not be repeated.

Hereinafter, the transistor in which some configurations are modified in the transistor shown in FIG. 1 according to an embodiment is described with reference to FIG. 4.

Figure 4:
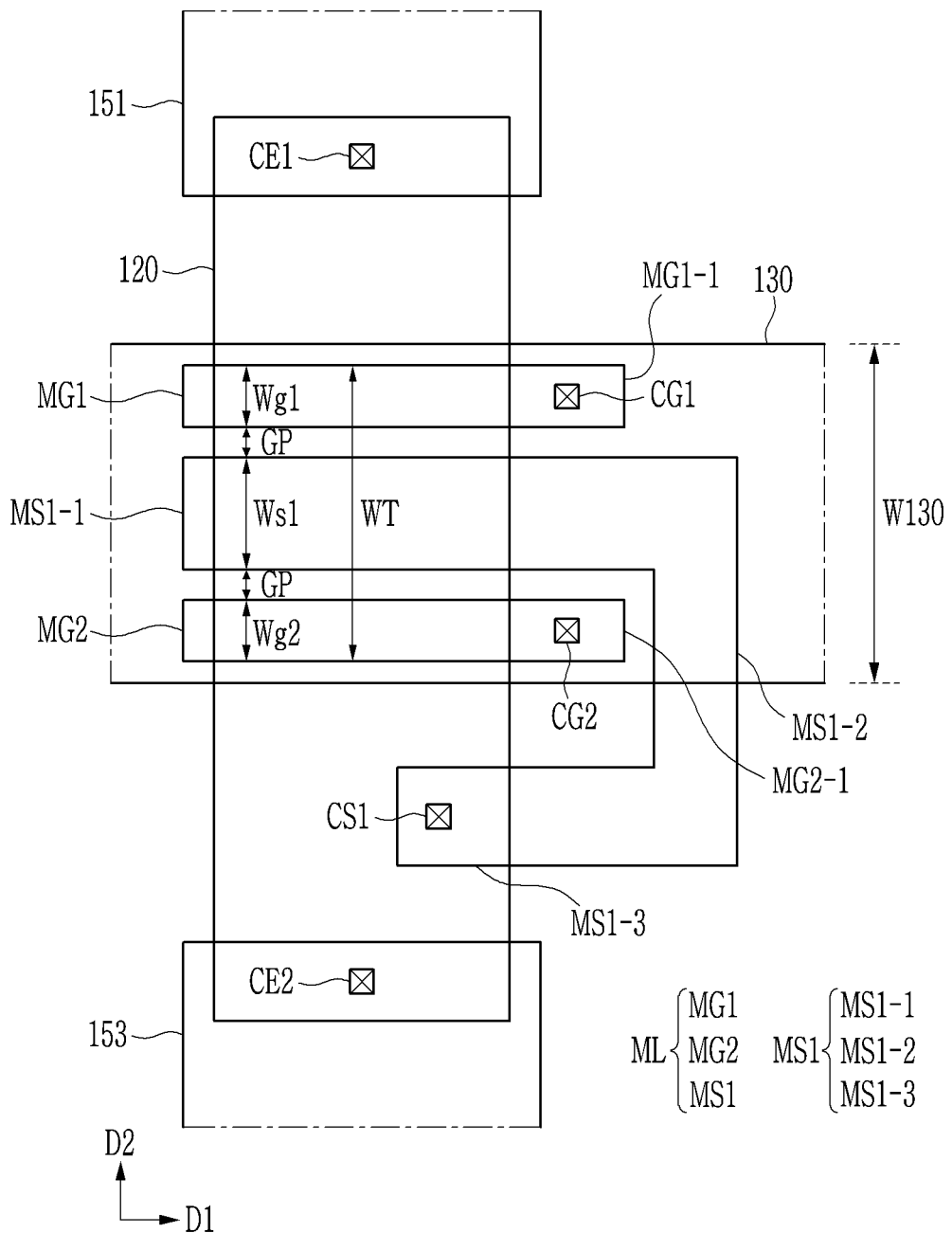
FIG. 4 is a top plan view showing a transistor of an embodiment in which some configurations shown in FIG. 1 are modified.

FIG. 4 is a top plan view showing a transistor of an embodiment in which some configurations shown in FIG. 1 are modified. Thus, the differences between the embodiment of FIG. 4 compared with the embodiments of FIG. 1 and FIG. 2 described above are mainly described hereinafter, and redundant description therebetween may not be repeated.

Referring to FIG. 4, on a plane (e.g., in a plan view), the width WT of the entire region including the first gate contact overlapping layer MG1, the second gate contact overlapping layer MG2, the first overlapping part MS1-1 of the semiconductor contact overlapping layer MS1, and a plurality of gaps GP may be smaller than the width W130 of the channel region of the semiconductor layer 120. In this case, the width Ws1 of the first overlapping part MS1-1 of the semiconductor contact overlapping layer MS1 may be greater than each of the width Wg1 of the first gate contact overlapping layer MG1 and the width Wg2 of the second gate contact overlapping layer MG2. As another example, the width Ws1 of the first overlapping part MS1-1 of the semiconductor contact overlapping layer MS1 may be the same or substantially the same as, or less than, each of the width Wg1 of the first gate contact overlapping layer MG1 and the width Wg2 of the second gate contact overlapping layer MG2.

Other than the above-described differences, because the features of the embodiments described with reference to FIG. 1 and FIG. 2 may all be applied to the embodiments described with reference to FIG. 4, redundant description thereof may not be repeated.

Hereinafter, the transistor in which some configurations are modified in the transistor shown in FIG. 1 according to an embodiment is described with reference to FIG. 5.

Figure 5:
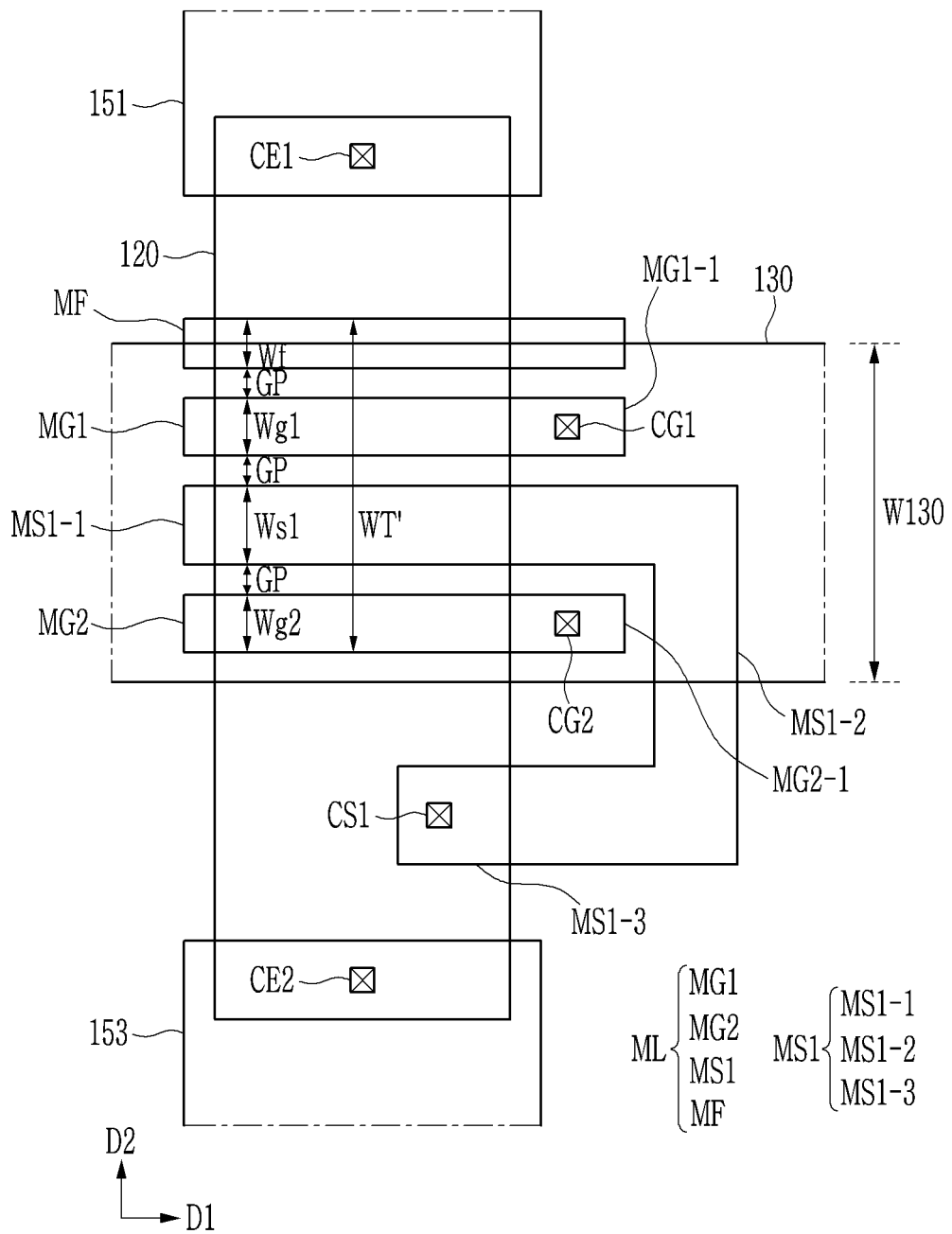
FIG. 5 is a top plan view showing a transistor of an embodiment in which some configurations shown in FIG. 1 are modified.

FIG. 5 is a top plan view showing a transistor of an embodiment in which some configurations shown in FIG. 1 are modified. Thus, the differences between the embodiment of FIG. 5 compared with the embodiments of FIG. 1, FIG. 2, and FIG. 4 described above are mainly described hereinafter, and redundant description therebetween may not be repeated.

Referring to FIG. 5, the overlapping layer ML may further include a floating overlapping layer MF that is not connected to the semiconductor layer 120 and the gate electrode 130, and that overlaps with the channel region of the semiconductor layer 120. The floating overlapping layer MF is insulated from other conductors, and no voltage may be applied to the floating overlapping layer MF.

The floating overlapping layer MF may be disposed at (e.g., in or on) the same layer as that of the gate contact overlapping layers MG1 and MG2 and the semiconductor contact overlapping layer MS1. Further, on a plane (e.g., in a plan view), the floating overlapping layer MF may be disposed to be close to (e.g., to be adjacent to) at least one from among the gate contact overlapping layers MG1 and MG2, and the first overlapping part MS1-1 of the semiconductor contact overlapping layer MS1 via the gap GP.

FIG. 5 illustrates that the floating overlapping layer MF is adjacent to the first gate contact overlapping layer MG1. The floating overlapping layer MF and the first gate contact overlapping layer MG1 are disposed to be spaced apart (e.g., separated) from each other by the gap GP, and the floating overlapping layer MF and the first gate contact overlapping layer MG1 are physically divided from each other by the gap GP. The floating overlapping layer MF may overlap with the channel region of the semiconductor layer 120, and may extend in the first direction D1 to be parallel to or substantially parallel to the first gate contact overlapping layer MG1.

A width Wf of the floating overlapping layer MF may be the same or substantially the same as at least any one of the width Wg1 of the first gate contact overlapping layer MG1, the width Wg2 of the second gate contact overlapping layer MG2, and/or the width Ws1 of the first overlapping part MS1-1 of the semiconductor contact overlapping layer MS1. As another example, the width Wf of the floating overlapping layer MF may be different from each of the width Wg1 of the first gate contact overlapping layer MG1, the width Wg2 of the second gate contact overlapping layer MG2, and the width Ws1 of the first overlapping part MS1-1 of the semiconductor contact overlapping layer MS1. In this case, the width Wg1 of the first gate contact overlapping layer MG1, the width Wg2 of the second gate contact overlapping layer MG2, and the width Ws1 of the first overlapping part MS1-1 of the semiconductor contact overlapping layer MS1 may be the same or substantially the same as each other, or may be different from each other. Further, the width WT' of the entire region including the floating overlapping layer MF, the first gate contact overlapping layer MG1, the second gate contact overlapping layer MG2, the first overlapping part MS1-1 of the semiconductor contact overlapping layer MS1, and a plurality of gaps GP may be the same or substantially the same as, larger than, or smaller than the width W130 of the channel region of the semiconductor layer 120.

Other than these above-described differences, because the features of the embodiments described above with reference to FIG. 1 and FIG. 2 may all be applied to the embodiments described with reference to FIG. 5, redundant description thereof may not be repeated.

Hereinafter, a transistor according to another embodiment is described with reference to FIG. 6 and FIG. 7.

Figure 6:
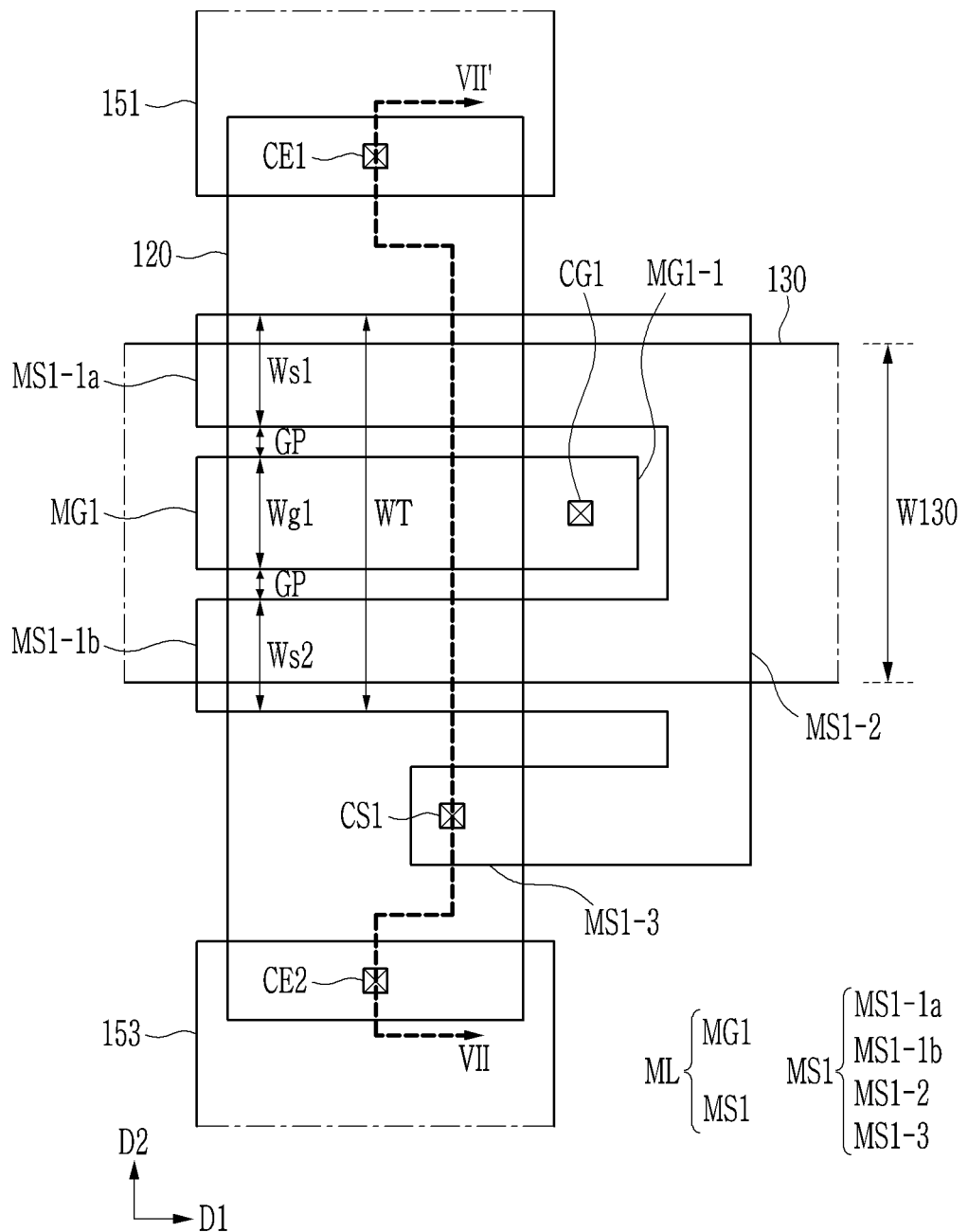
FIG. 6 is a top plan view showing a transistor according to another embodiment of the present disclosure.

FIG. 6 is a top plan view showing a transistor according to another embodiment of the present disclosure. FIG. 7 is a cross-sectional view taken along the line VII-VII' of FIG. 6. The differences of the embodiment of FIG. 6 and FIG. 7 compared with the embodiments of FIG. 1 and FIG. 2 described above are mainly described hereinafter, and thus, redundant description therebetween may not be repeated.

Figure 7:
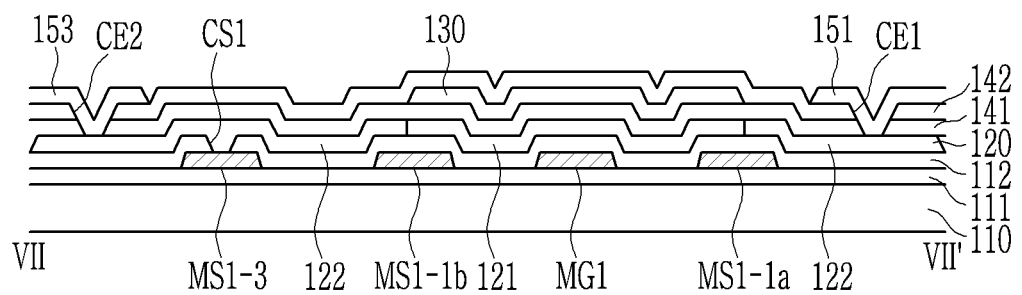
FIG. 7 is a cross-sectional view taken along the line VII-VII' of FIG. 6.

Referring to FIG. 6 and FIG. 7, the overlapping layer ML includes a first gate contact overlapping layer MG1, and a semiconductor contact overlapping layer MS1. The first gate contact overlapping layer MG1 partially overlaps with the semiconductor layer 120, and is in contact with the gate electrode 130 through the first gate contact hole CG1.

The first gate contact overlapping layer MG1 is positioned at a central portion of the gate electrode 130, and extends in the first direction D1 to overlap with the channel region. The first gate contact overlapping layer MG1 includes a first extending part MG1-1 that extends further in the first direction D1 than the semiconductor layer 120, and that does not overlap with the semiconductor layer 120 but overlaps with the gate electrode 130. The first gate contact hole CG1 is positioned at the position overlapping with the first extending part MG1-1, and the first gate contact overlapping layer MG1 may be directly connected to the gate electrode 130 through the first gate contact hole CG1.

The semiconductor contact overlapping layer MS1 may include a first overlapping part MS1-1a, a second overlapping part MS1-1b, an extending part MS1-2, and a contact part MS1-3. The first overlapping part MS1-1a extends in the first direction D1 along one side of the gate electrode 130 to overlap with the channel region. The first overlapping part MS1-1a may overlap with the semiconductor layer 120 and the gate electrode 130. The second overlapping part MS1-1b extends in the first direction D1 along another side (e.g., an opposite side) of the gate electrode 130 to overlap with the channel region. The second overlapping part MS1-1b may overlap with the semiconductor layer 120 and the gate electrode 130. The contact part MS1-3 does not overlap with the gate electrode 130, but overlaps with the semiconductor layer 120. The semiconductor contact hole CS1 is positioned in the contact part MS1-3, and the contact part MS1-3 may be in contact with the semiconductor layer 120 through the semiconductor contact hole CS1. The extending part MS1-2 has a structure that connects the first overlapping part MS1-1a, the second overlapping part MS1-1b, and the contact part MS1-3 to each other. The extending part MS1-2 may not overlap with the semiconductor layer 120.

On a plane (e.g., in a plan view), the first gate contact overlapping layer MG1 may be disposed between the first overlapping part MS1-1a and the second overlapping part MS1-1b of the semiconductor contact overlapping layer MS1, and may be parallel to or substantially parallel to the first overlapping part MS1-1a and the second overlapping part MS1-1b.

On a plane (e.g., in a plan view), the first gate contact overlapping layer MG1 and the first overlapping part MS1-1a of the semiconductor contact overlapping layer MS1 are disposed to be spaced apart (e.g., separated) from each other by the gap GP. Also, the first gate contact overlapping layer MG1 and the second overlapping part MS1-1b of the semiconductor contact overlapping layer MS1 are spaced apart from each other by the gap GP. The first gate contact overlapping layer MG1 and the first overlapping part MS1-1a of the semiconductor contact overlapping layer MS1 are physically separated (e.g., spaced apart) from each other by the gap GP within the channel region. In addition, the first gate contact overlapping layer MG1 and the second overlapping part MS1-1b of the semiconductor contact overlapping layer MS1 are physically separated (e.g., spaced apart) from each other by the gap GP within the channel region.

The first gate contact overlapping layer MG1, the first overlapping part MS1-1a of the semiconductor contact overlapping layer MS1, and the second overlapping part MS1-1b overlap with the channel region of the semiconductor layer 120, and the overlapping layer ML does not overlap with the channel region of the semiconductor layer 120 at (e.g., in or on) the gap GP.

The width Wg1 of the first gate contact overlapping layer MG1, the width Ws1 of the first overlapping part MS1-1a of the semiconductor contact overlapping layer MS1, and the width Ws2 of the second overlapping part MS1-1b of the semiconductor contact overlapping layer MS1 may be the same or substantially the same as each other. Further, the width WT of the entire region including the first gate contact overlapping layer MG1, the first overlapping part MS1-1a of the semiconductor contact overlapping layer MS1, the second overlapping part MS1-1b of the semiconductor contact overlapping layer MS1, and a plurality of gaps GP may be larger than the width W130 of the channel region of the semiconductor layer 120.

The first gate contact hole CG1 (e.g., see FIG. 6) is formed in the buffer layer 112 and the first gate insulating layer 141. A part of the first gate overlapping layer MG1 is exposed by the first gate contact hole CG1. The gate electrode 130 overlaps with the first gate contact hole CG1, and may be connected to the first gate contact overlapping layer MG1 through the first gate contact hole CG1. In the embodiment of FIG. 6 and FIG. 7, the second gate contact hole CG2 described above with reference to FIG. 1 and FIG. 2 may be omitted.

Other than these above described differences, because the features of the embodiments described above with reference to FIG. 1 and FIG. 2 may all be applied to the embodiment described with reference to FIG. 6 and FIG. 7, redundant description thereof may not be repeated.

Hereinafter, the transistor in which some configurations are modified in the transistor shown in FIG. 6 according to an embodiment is described with reference to FIG. 8.

Figure 8:
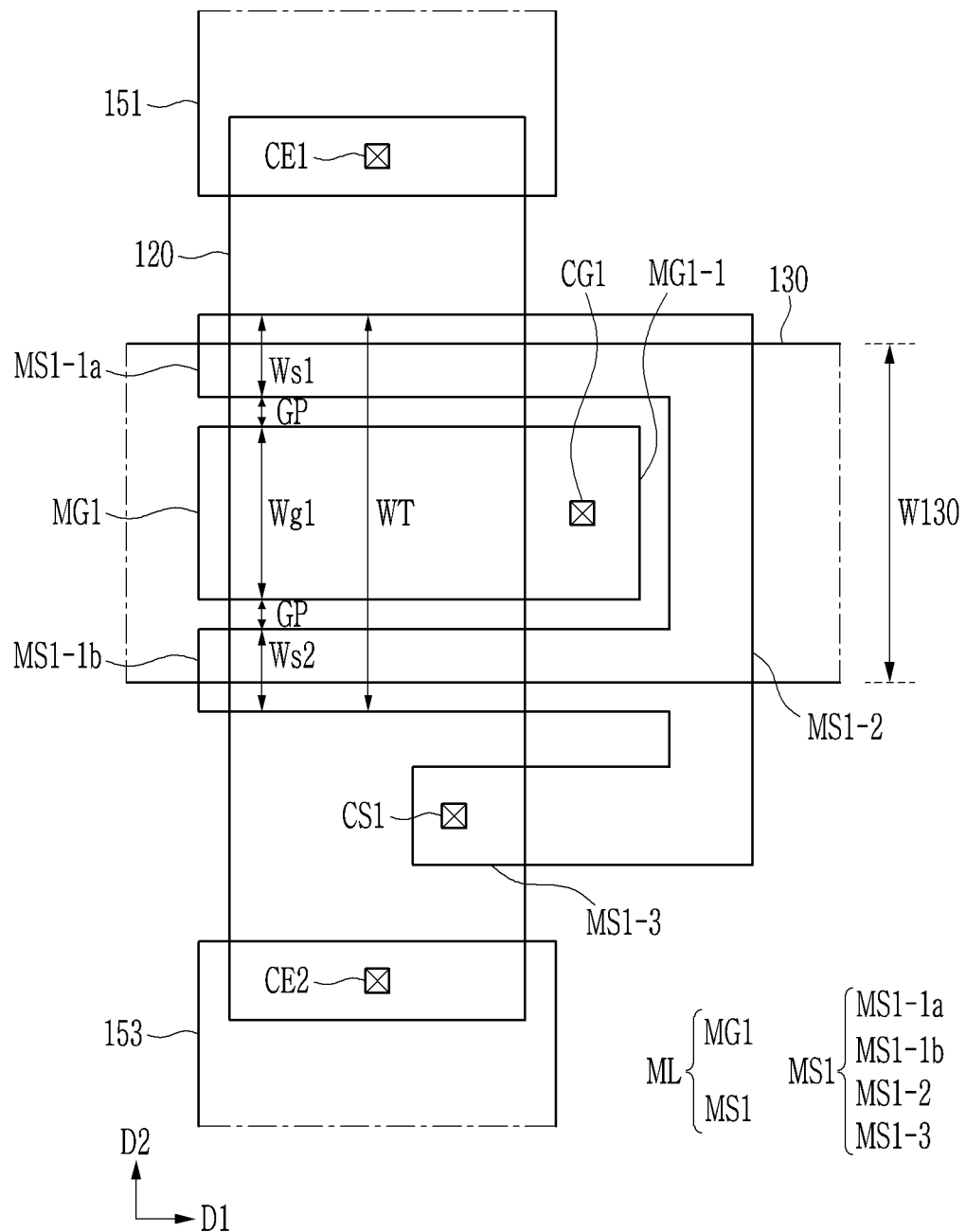
FIG. 8 is a top plan view showing a transistor of an embodiment in which some configurations shown in FIG. 6 are modified.

FIG. 8 is a top plan view showing a transistor of an embodiment in which some configurations shown in FIG. 6 are modified. Thus, the differences between the embodiment of FIG. 8 compared with the embodiments of FIG. 1 and FIG. 2 described above are mainly described hereinafter, and redundant description therebetween may not be repeated.

Referring to FIG. 8, the width Wg1 of the first gate contact overlapping layer MG1 may be larger than the width Ws1 of the first overlapping part MS1-1a of the semiconductor contact overlapping layer MS1. Further, the width Wg1 of the first gate contact overlapping layer MG1 may be greater than the width Ws2 of the second overlapping part MS1-1b of the semiconductor contact overlapping layer MS1. In other words, the width Wg1 of the first gate contact overlapping layer MG1 may be different from the width Ws1 of the first overlapping part MS1-1a of the semiconductor contact overlapping layer MS1 and the width Ws2 of the second overlapping part MS1-1*b* of the semiconductor contact overlapping layer MS1. The width Ws1 of the first overlapping part MS1-1*a* of the semiconductor contact overlapping layer MS1 and the width Ws2 of the second overlapping part MS1-1*b* of the semiconductor contact overlapping layer MS1 may be the same or substantially the same as each other, or may be different from each other. Even in this case, the width WT of the entire region including the first gate contact overlapping layer MG1, the first overlapping part MS1-1*a* of the semiconductor contact overlapping layer MS1, the second overlapping part MS1-1*b* of the semiconductor contact overlapping layer MS1, and a plurality of gaps GP may be greater than the width W130 of the channel region of the semiconductor layer 120.

On the other hand, in contrast to the example of FIG. 8, in some embodiments, the width Wg1 of the first gate contact overlapping layer MG1 may be smaller than the width Ws1 of the first overlapping part MS1-1*a* of the semiconductor contact overlapping layer MS1, and may be smaller than the width Ws2 of the second overlapping part MS1-1*b* of the semiconductor contact overlapping layer MS1. Even in this case, the width WT of the entire region including the first gate contact overlapping layer MG1, the first overlapping part MS1-1*a* of the semiconductor contact overlapping layer MS1, the second overlapping part MS1-1*b* of the semiconductor contact overlapping layer MS1, and a plurality of gaps GP may be larger than the width W130 of the channel region of the semiconductor layer 120.

Other than these above described differences, because the features of the embodiment described above with reference to FIG. 6 and FIG. 7 may all be applied to the embodiments described with reference to FIG. 8, redundant description thereof may not be repeated.

Hereinafter, the transistor in which some configurations are modified in the transistor shown in FIG. 6 according to an embodiment is described with reference to FIG. 9.

Figure 9:
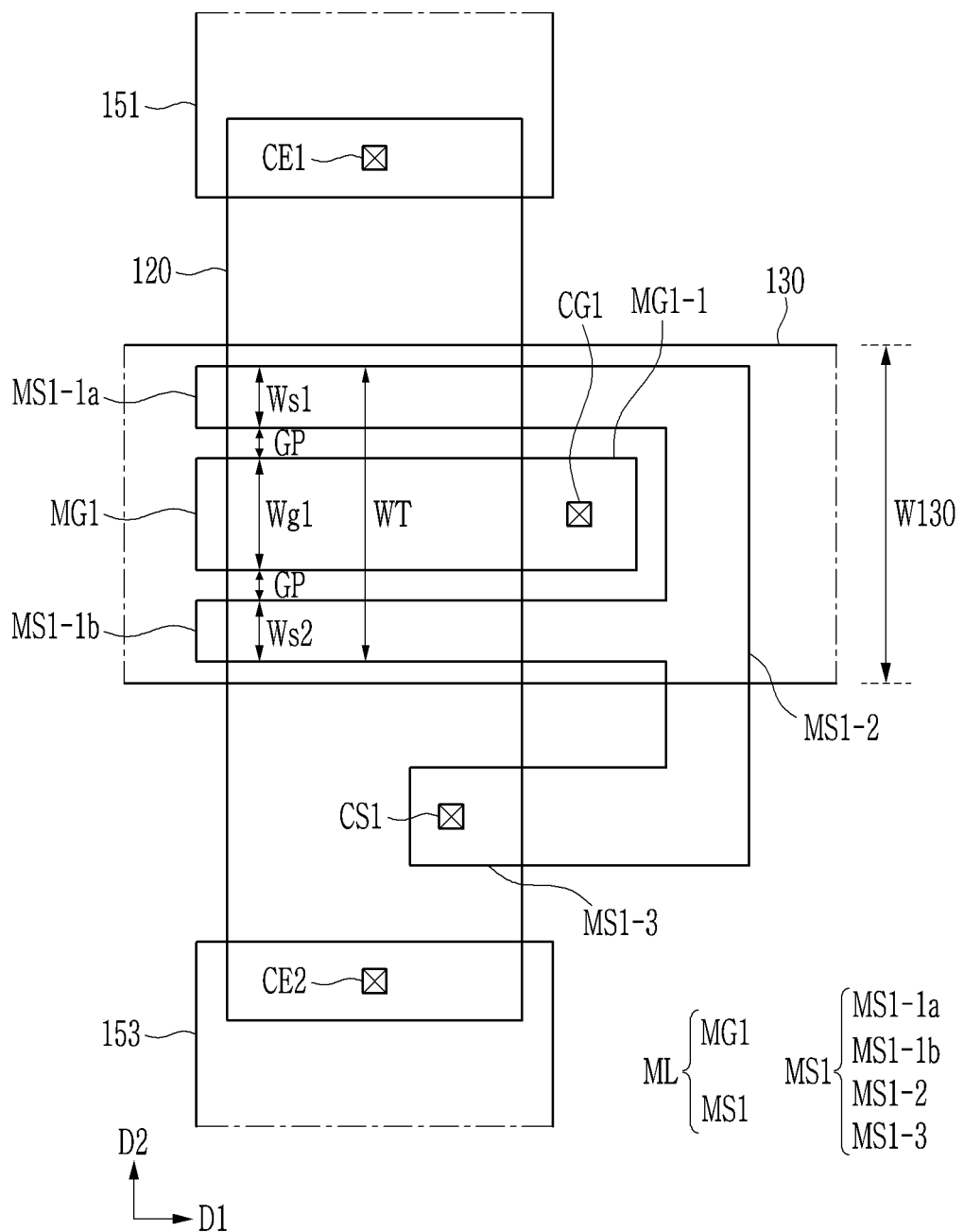
FIG. 9 is a top plan view showing a transistor of an embodiment in which some configurations shown in FIG. 6 are modified.

FIG. 9 is a top plan view showing a transistor of an embodiment in which some configurations shown in FIG. 6 are modified. Thus, the differences between the embodiment of FIG. 9 compared with the embodiment of FIG. 6 and FIG. 7 described above are mainly described hereinafter, and redundant description therebetween may not be repeated.

Referring to FIG. 9, the width WT of the entire region including the first gate contact overlapping layer MG1, the first overlapping part MS1-1*a* of the semiconductor contact overlapping layer MS1, the second overlapping part MS1-1*b* of the semiconductor contact overlapping layer MS1, and a plurality of gaps GP may be smaller than the width W130 of the channel region of the semiconductor layer 120. In this case, the width Wg1 of the first gate contact overlapping layer MG1 may be greater than the width Ws1 of the first overlapping part MS1-1*a* of the semiconductor contact overlapping layer MS1 and the width Ws2 of the second overlapping part MS1-1*b* of the semiconductor contact overlapping layer MS1. As another example, the width Wg1 of the first gate contact overlapping layer MG1 may be equal to or substantially equal to, or less than, the width Ws1 of the first overlapping part MS1-1*a* of the semiconductor contact overlapping layer MS1 and the width Ws2 of the second overlapping part MS1-1*b*) of the semiconductor contact overlapping layer MS1.

Other than these above-described differences, because the features of the embodiment described with reference to FIG. 6 and FIG. 7 may all be applied to the embodiments described with reference to FIG. 9, redundant description thereof may not be repeated.

Hereinafter, the transistor in which some configurations are modified in the transistor shown in FIG. 6 according to an embodiment is described with reference to FIG. 10.

Figure 10:
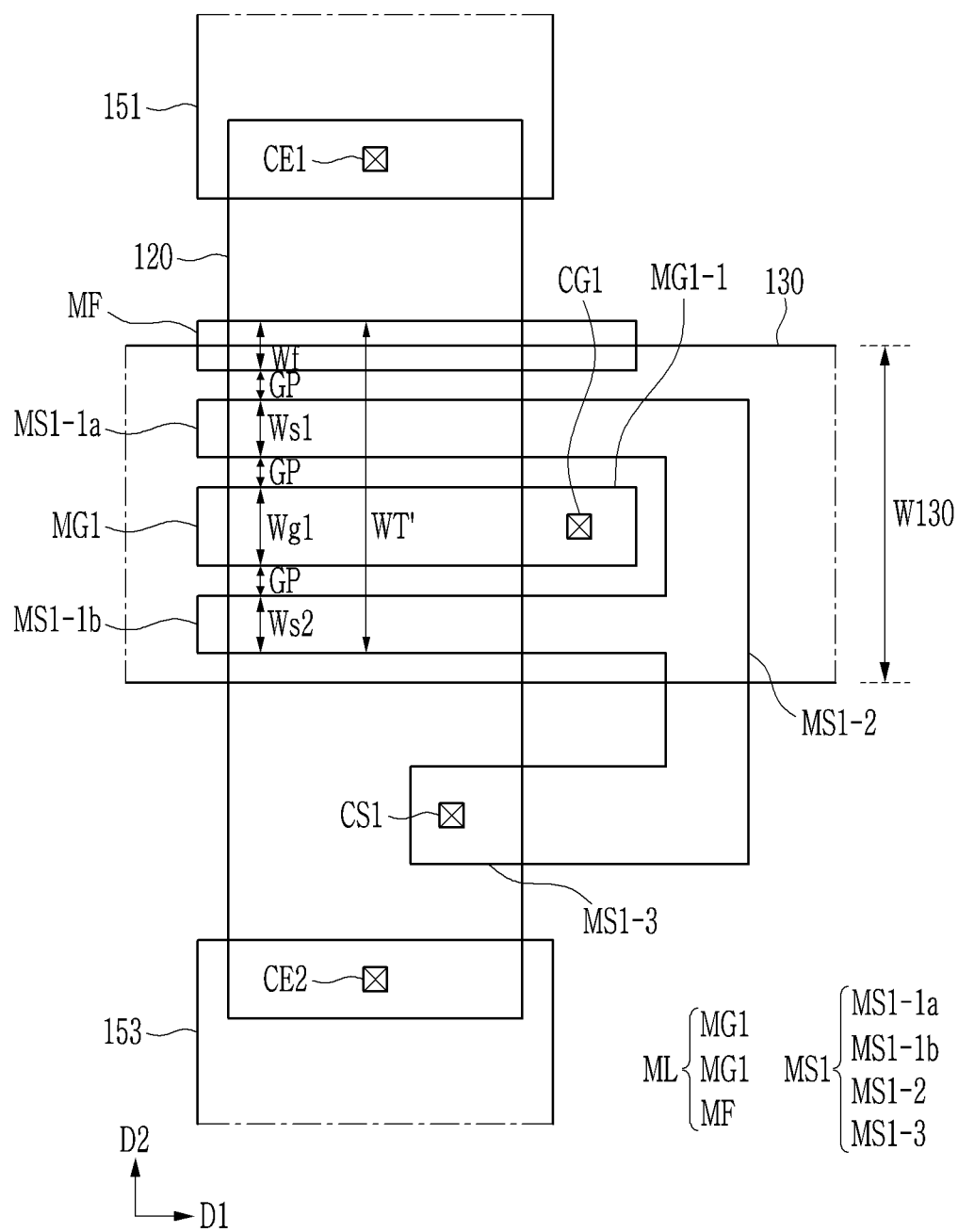
FIG. 10 is a top plan view showing a transistor of an embodiment in which some configurations shown in FIG. 6 are modified.

FIG. 10 is a top plan view showing a transistor of an embodiment in which some configurations shown in FIG. 6 are modified. Thus, the differences between the embodiment of FIG. 10 compared with the embodiment of FIG. 6 and FIG. 7 described above are mainly described hereinafter, and redundant description therebetween may not be repeated.

Referring to FIG. 10, the overlapping layer ML may further include a floating overlapping layer MF that overlaps with the channel region without being connected to the semiconductor layer 120 and the gate electrode 130. The floating overlapping layer MF is insulated from other conductors, and no voltage may be applied to the floating overlapping layer MF.

The floating overlapping layer MF may be positioned at (e.g., in or on) the same layer as that of the first gate contact overlapping layer MG1 and the semiconductor contact overlapping layer MS1. The floating overlapping layer MF may be spaced apart from at least one of the first gate contact overlapping layer MG1, the first overlapping part MS1-1*a* of the semiconductor contact overlapping layer MS1, and/or the second overlapping part MS1-1*b* of the semiconductor contact overlapping layer MS1 by the gap GP on a plane (e.g., in a plan view).

FIG. 10 illustrates that the floating overlapping layer MF is close to (e.g., adjacent to) the first overlapping part MS1-1*a* of the semiconductor contact overlapping layer MS1. The floating overlapping layer MF and the first overlapping part MS1-1*a* of the semiconductor contact overlapping layer MS1 are spaced apart from each other by the gap GP, and the floating overlapping layer MF and the semiconductor contact overlapping layer MS1 are physically separated (e.g., spaced apart) from each other by the gap GP. The floating overlapping layer MF may overlap with the channel region of the semiconductor layer 120, and may be extended in the first direction D1 to be parallel to or substantially parallel to the first overlapping part MS1-1*a* of the semiconductor contact overlapping layer MS1.

The width Wf of the floating overlapping layer MF may be the same or substantially the same as at least any suitable one of the width Wg1 of the first gate contact overlapping layer MG1, the width Ws1 of the first overlapping part MS1-1*a* of the semiconductor contact overlapping layer MS1, and/or the width Ws2 of the second overlapping part MS1-1*b* of the semiconductor contact overlapping layer MS1. As another example, the width Wf of the floating overlapping layer MF may be different from each of the width Wg1 of the first gate contact overlapping layer MG1, the width Ws1 of the first overlapping part MS1-1*a* of the semiconductor contact overlapping layer MS1, and the width Ws2 of the second overlapping part MS1-1*b* of the semiconductor contact overlapping layer MS1. In this case, the width Wg1 of the first gate contact overlapping layer MG1, the width Ws1 of the first overlapping part MS1-1*a* of the semiconductor contact overlapping layer MS1, and the width Ws2 of the second overlapping part MS1-1*b* of the semiconductor contact overlapping layer MS1 may be the same or substantially the same as each other, or may be different from each other. Further, the width WT' of the entire region including the floating overlapping layer MF, the first gate contact overlapping layer MG1, the first overlapping part MS1-1*a* of the semiconductor contact overlapping layer MS1, the second overlapping part MS1-1*b* of the semiconductor contact overlapping layer MS1, and a plurality of gaps GP may be equal to or substantially equal to, or larger than, the width W130 of the channel region of the semiconductor layer 120, or may be smaller than the width W130 of the channel region of the semiconductor layer 120.

Other than these above-described differences, because the features of the embodiment described with reference to FIG. 6 and FIG. 7 may all be applied to the embodiment described with reference to FIG. 10, redundant description thereof may not be repeated.

In the embodiments of FIG. 1 to FIG. 4 and FIG. 6 to FIG. 9 described above, the overlapping layer ML at (e.g., in or on) the channel region of the semiconductor layer 120 includes three separation structures that are spaced apart (e.g., separated) from each other by two gaps GP, and in the embodiments of FIG. 5 and FIG. 10 described above, the overlapping layer ML within the channel region of the semiconductor layer 120 includes four separation structures spaced apart (e.g., separated) from each other by three gaps GP. As such, the overlapping layer ML may be formed of a plurality of separation structures within the channel region of the semiconductor layer 120. The number of the separation structures of the overlapping layer ML at (e.g., in or on) the channel region of the semiconductor layer 120 is not limited to those of the example embodiments presented herein.

Hereinafter, an embodiment including two separation structures in which the overlapping layer ML is separated (e.g., portions of the overlapping layer ML are spaced apart from each other) by one gap GP is described with reference to FIG. 11.

Figure 11:
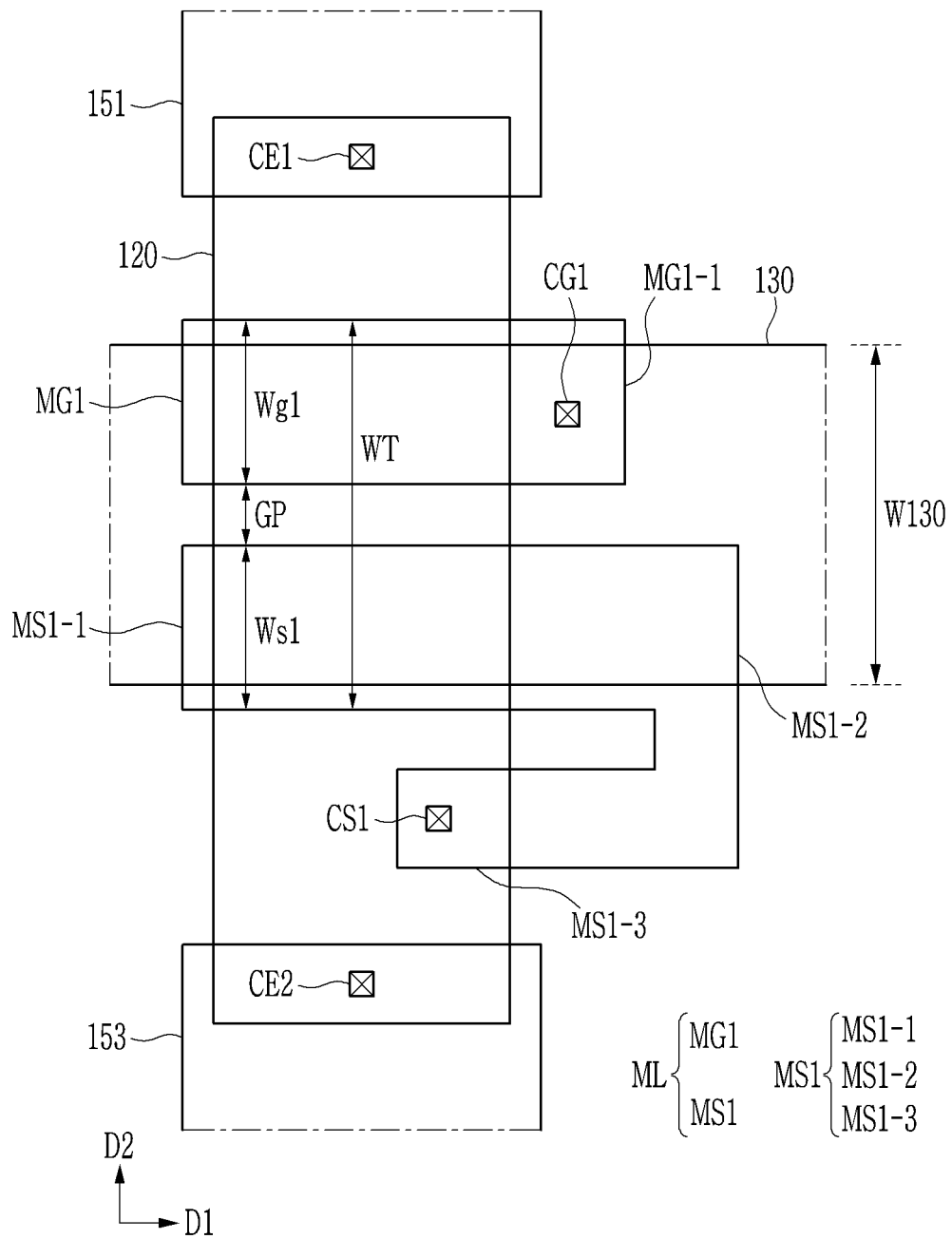
FIG. 11 is a top plan view showing a transistor according to another embodiment of the present disclosure.

FIG. 11 is a top plan view showing a transistor according to another embodiment of the present disclosure. The differences between the embodiment of FIG. 11 compared with the embodiments of FIG. 1 and FIG. 2 described above are mainly described hereinafter, and redundant description therebetween may not be repeated.

Referring to FIG. 11, compared with the embodiment of FIG. 1, the second gate contact overlapping layer MG2 in FIG. 11 is omitted. The first overlapping part MS1-1 of the semiconductor contact overlapping layer MS1 extends along the other side (e.g., the opposite side) of the gate electrode 130 in the first direction D1. The first gate contact overlapping layer MG1 and the first overlapping part MS1-1 of the semiconductor contact overlapping layer MS1 are spaced apart from each other by the gap GP, and the first gate contact overlapping layer MG1 and the first overlapping part MS1-1 of the semiconductor contact overlapping layer MS1 may be physically separated (e.g., spaced apart) from each other by the gap GP.

Other than these above-described differences, the features of the embodiment described with reference to FIG. 1 and FIG. 2 may all be applied to the embodiment described with reference to FIG. 11. Further, the features of the embodiments in which some configurations described with reference to FIG. 3 to FIG. 5 are modified may all be applied to the embodiment described with reference to FIG. 11. Accordingly, redundant description thereof may not be repeated.

An embodiment in which the overlapping layer ML is formed as one unitary part is now described with reference to FIG. 12.

Figure 12:
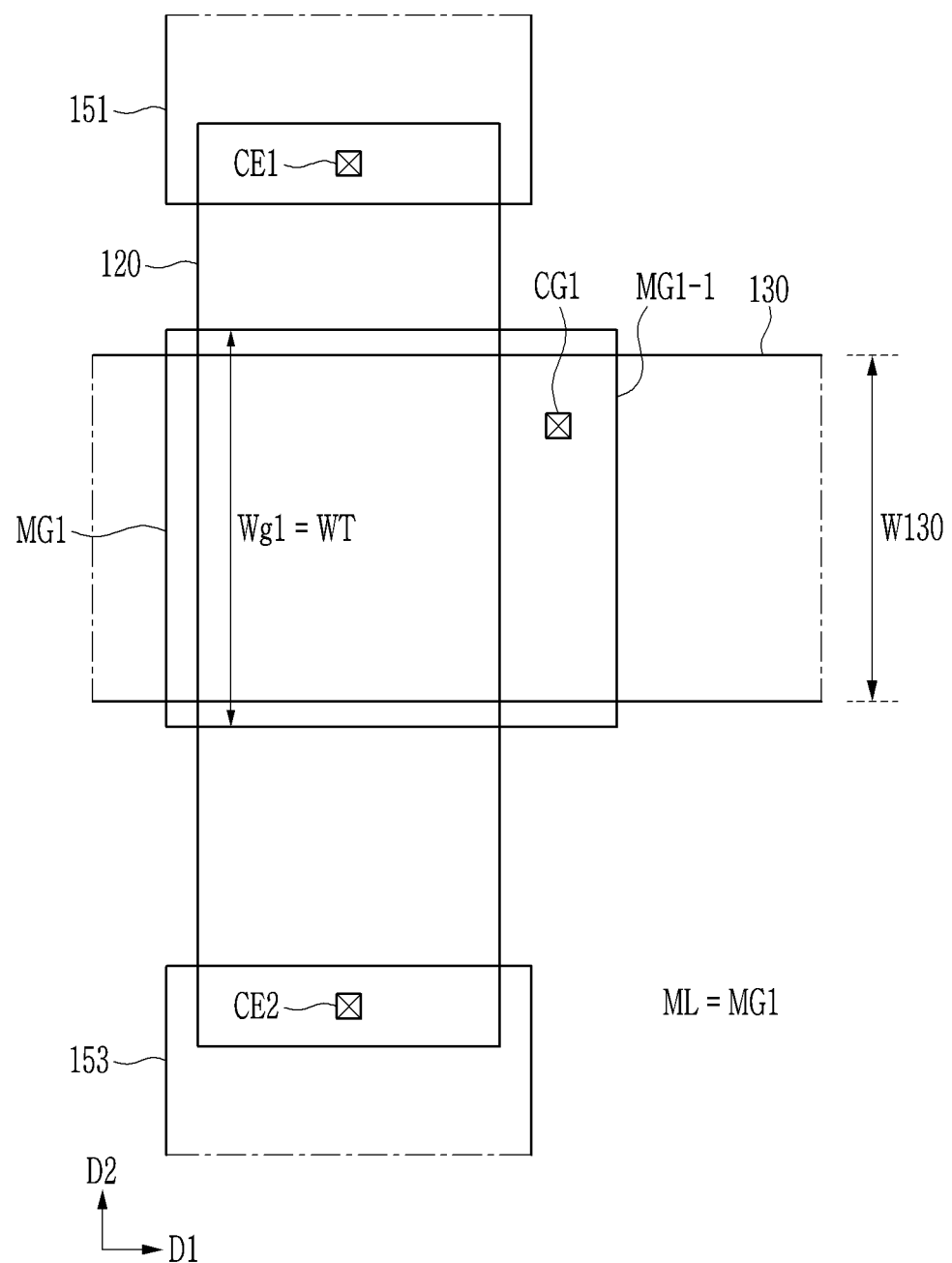
FIG. 12 is a top plan view showing a transistor according to another embodiment of the present disclosure.

FIG. 12 is a top plan view showing a transistor according to another embodiment of the present disclosure. The differences in the embodiment of FIG. 12 compared with the embodiment of FIG. 1 and FIG. 2 described above are mainly described hereinafter, and redundant description therebetween may not be repeated.

Referring to FIG. 12, the overlapping layer ML may include only the first gate contact overlapping layer MG1 without including the semiconductor contact overlapping layer MS1 described with reference to FIG. 1 and FIG. 2. The width Wg1 of the first gate contact overlapping layer MG1 may correspond to (e.g., may be equal to or substantially equal to) the width WT of the entire overlapping layer ML. The width Wg1 of the first gate contact overlapping layer MG1 may be larger than the width W130 of the gate electrode 130. In other words, the first gate contact overlapping layer MG1 may overlap with the entire channel region of the transistor.

Other than these above-described differences, because the features of the embodiment described with reference to FIG. 1 and FIG. 2 may all be applied to the embodiment described with reference to FIG. 11, redundant description thereof may not be repeated.

Hereinafter, a display device according to an embodiment is described with reference to FIG. 13, and a pixel according to an embodiment of the present disclosure that is included in the display device is described with reference to FIG. 14.

Figure 13:
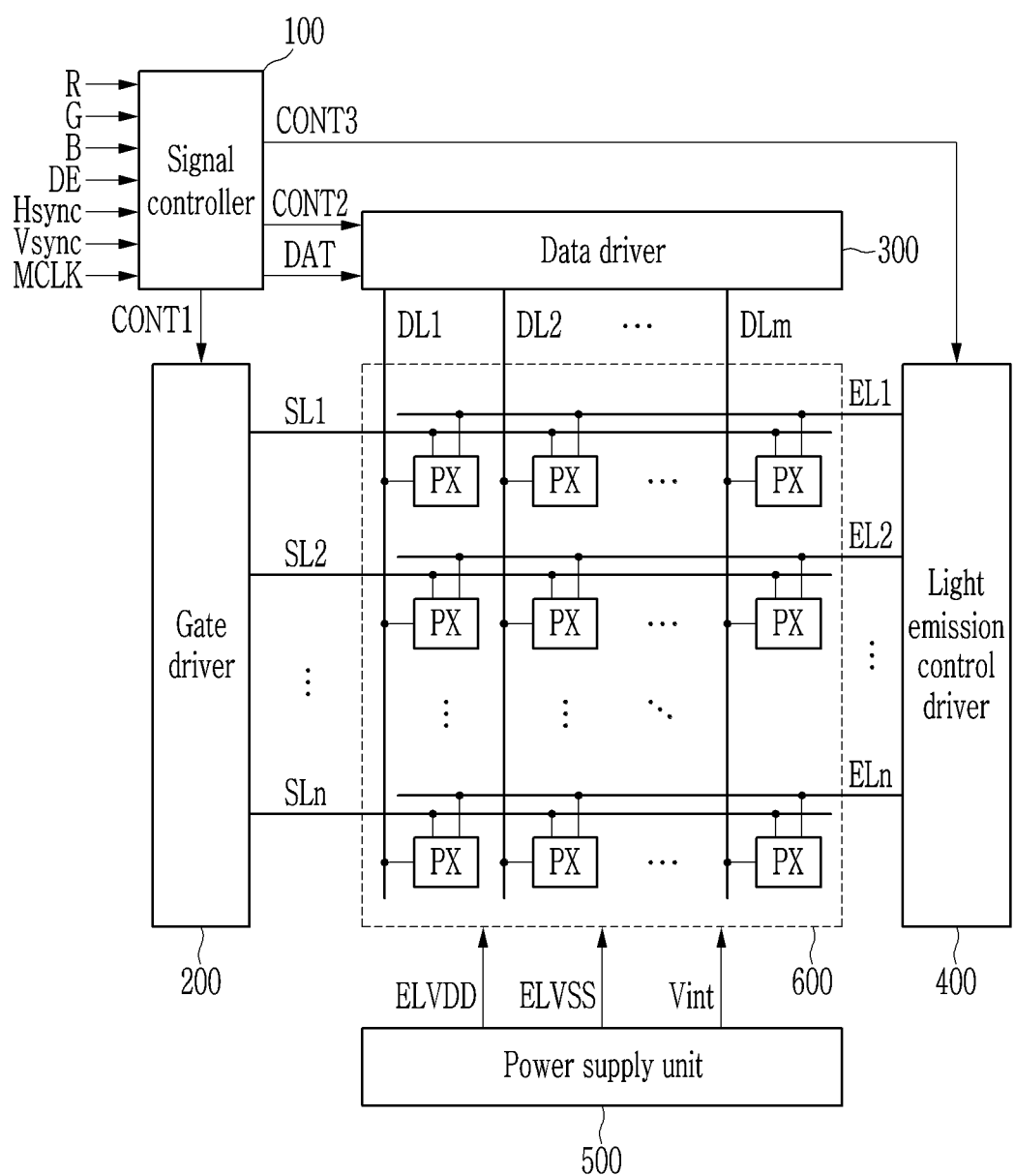
FIG. 13 is a block diagram of a display device according to an embodiment.

FIG. 13 is a block diagram of a display device according to an embodiment.

Referring to FIG. 13, a display device includes a signal controller 100, a gate driver 200, a data driver 300, a light emission control driver 400, a power supply unit (e.g., a power supply or a power supply circuit) 500, and a display unit (e.g., a display, a display panel, or a display layer) 600.

The signal controller 100 receives image signals R, G, and B input from an external device, and input control signals that control a display of the display device. The image signals R, G, and B store luminance information of each pixel PX, and the luminance has a number (e.g., a predetermined number) of gray levels. Some examples of the input control signals include a data enable signal DE, a horizontal synchronizing signal Hsync, a vertical synchronization signal Vsync, a main clock signal MCLK, and the like.

The signal controller 100 appropriately processes the input image signals R, G, and B in accordance with operation conditions of the display unit 600 and the data driver 300 based on the input image signals R, G, and B and the input control signals, and generates a first control signal CONT1, a second control signal CONT2, an image data signal DAT, and a third control signal CONT3. The signal controller 100 transmits the first control signal CONT1 to the gate driver 200, the second control signal CONT2 and the image data signal DAT to the data driver 300, and the third control signal CONT3 to the light emission control driver 400.

The display unit 600 includes a plurality of gate lines SL1-SLn, a plurality of data lines DL1-DLm, a plurality of light emission control lines EL1-ELn, and a plurality of pixels PX (where n and m are natural integers). The plurality of pixels PX are connected to the plurality of gate lines SL1-SLn, the plurality of data lines DL1-DLm, and the plurality of light emission control lines EL1-ELn, and may be arranged in an appropriate matrix form. The plurality of gate lines SL1-SLn may extend in a row direction or an approximate row direction, and may be parallel to or substantially parallel to each other. The plurality of light emission control lines EL1-ELn may extend in the row direction or the approximate row direction, and may be parallel to or substantially parallel to each other. The plurality of data lines DL1-DLm may extend in a column direction or an approximate column direction, and may be parallel to or substantially parallel to each other. The display unit 600 may correspond to a display area at (e.g., in or on) which a plurality of pixels PX are positioned, and an image may be displayed at (e.g., in or on) the display area.

The gate driver 200 is connected to the plurality of gate lines SL1-SLn, and transmits a gate signal including (e.g., consisting of) a combination of a gate-on voltage and a gate-off voltage to the plurality of gate lines SL1-SLn according to the first control signal CONT1. The gate driver 200 may sequentially apply the gate signal having the gate-on voltage to the plurality of gate lines SL1-SLn.

The gate driver 200 may be positioned at (e.g., in or on) a non-display area around (e.g., surrounding around a periphery of) the display area. In other words, the gate driver 200 may be positioned at (e.g., in or on) the non-display area on the substrate 110 included in the display device. The gate driver 200 includes a plurality of transistors for sequentially applying the gate signal having the gate-on voltage to the plurality of gate lines SL1-SLn, and at least one of the plurality of transistors may include any suitable one of the transistors described above with reference to FIG. 1 to FIG. 12.

The data driver 300 is connected to the plurality of data lines DL1-DLm. The data driver 300 samples and holds the image data signal DAT according to the second control signal CONT2, and applies a data voltage to the plurality of data lines DL1-DLm. The data driver 300 may apply the data voltage having a suitable voltage range (e.g., a predetermined voltage range) to the plurality of data lines DL1-DLm according to (e.g., by corresponding to) the gate signal of the gate-on voltage.

The light emission control driver 400 is connected to the plurality of light emission control lines EL1-ELn, and may apply a light emission control signal including a combination of a gate-on voltage and a gate-off voltage to the plurality of emission control lines EL1-ELn according to the third control signal CONT3. The light emission control driver 400 may sequentially apply the light emission control signal having the gate-on voltage to the plurality of light emission control lines EL1-ELn.

The light emission control driver 400 may be positioned at (e.g., in or on) the non-display area on the substrate 110 included in the display device. The light emission control driver 400 includes a plurality of transistors for sequentially applying the light emission control signal having the gate-on voltage to the plurality of light emission control lines EL1-ELn, and at least one of the plurality of transistors may include any suitable one of the transistors described above with reference to FIG. 1 to FIG. 12.

The power supply unit 500 supplies a first power source voltage ELVDD, a second power source voltage ELVSS, and an initialization voltage Vint to the plurality of pixels PX. The first power source voltage ELVDD may be a high level voltage provided to an anode of a light emitting diode LED included in each of the plurality of pixels PX. The second power source voltage ELVSS may be a low level voltage provided to a cathode of the light emitting diode LED included in each of the plurality of pixels PX. The first power source voltage ELVDD and the second power source voltage ELVSS are driving voltages for emitting the plurality of pixels PX.

Figure 14:
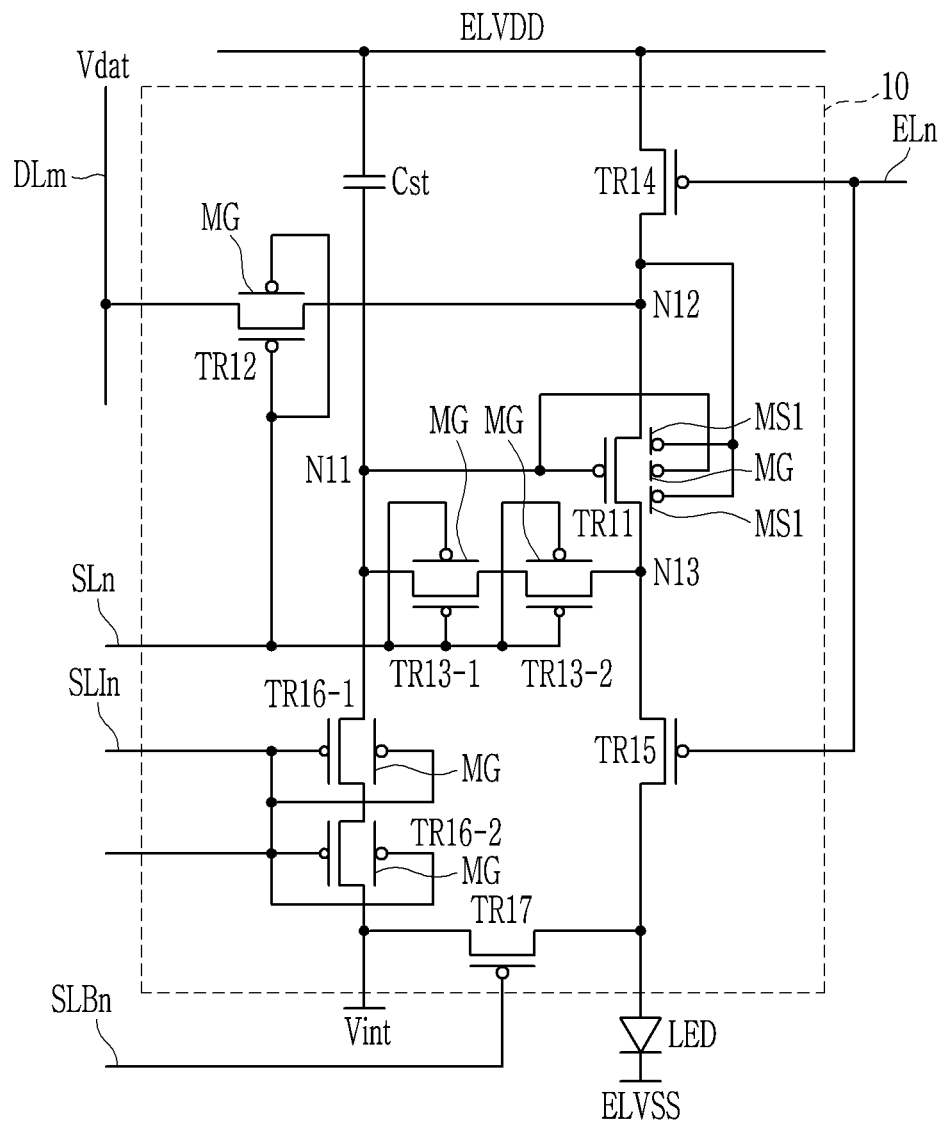
FIG. 14 is a circuit diagram showing a pixel of a display device according to an embodiment of the present disclosure.

FIG. 14 is a circuit diagram showing a pixel (e.g., one pixel) of a display device according to an embodiment of the present disclosure. The pixel PX positioned in an n-th pixel row and an m-th pixel column from among the plurality of pixels PX included in the display device of FIG. 13 is described in more detail hereinafter as an example.

Referring to FIG. 14, the pixel PX includes a pixel circuit 10 to control a current flowing from the light emitting diode LED and the first power source voltage ELVDD to the light emitting diode LED. A first gate line SLn, a second gate line SLIn, a third gate line SLBn, a data line DLm, and a light emission control line ELn may be connected to the pixel circuit 10. The second gate line SLIn may be the gate line (e.g., a previous gate line) to which the gate signal is applied to one pixel row before the first gate line SLn. The third gate line SLBn may be the gate line to which the gate signal is applied to one pixel row before the second gate line SLIn, the gate line to which the same gate signal as that of the second gate line SLIn is applied, the gate line to which the same gate signal as that of the first gate line SLn is applied, or the gate line (e.g., a next gate line) to which the gate signal is later applied to one pixel row after the first gate line SLn. The gate signal applied to the third gate line SLBn may be variously modified according to the driving method of the display device.

The pixel circuit 10 may include a driving transistor TR11, a switching transistor TR12, a compensation transistor TR13, a first light emission control transistor TR14, a second light emission control transistor TR15, an initialization transistor TR16, a reset transistor TR17, and a storage capacitor Cst.

The driving transistor TR11 includes a gate electrode connected to a first node N11, a first electrode connected to a third node N13, and a second electrode connected to a second node N12. The driving transistor TR11 is connected between the first power source voltage ELVDD and the light emitting diode LED, and controls an amount of current flowing from the first power source voltage ELVDD to the light emitting diode LED in response to a voltage of the first node N11. The driving transistor TR11 may further include a gate contact overlapping layer MG connected to the gate electrode, and a semiconductor contact overlapping layer MS1 connected to the second electrode. The gate contact overlapping layer MG of the driving transistor TR11 may be electrically connected to the first node N11, and the semiconductor contact overlapping layer MS1 of the driving transistor TR11 may be electrically connected to the second node N12. The gate contact overlapping layer MG and the semiconductor contact overlapping layer MS1 of the driving transistor TR11 overlap with the channel region of the driving transistor TR11. The gate contact overlapping layer MG may include the first gate contact overlapping layer MG1 and the second gate contact overlapping layer MG2 described above with reference to FIG. 1 to FIG. 4. In other words, in some embodiments, the driving transistor TR11 may be formed of a suitable one of the transistor structures described with reference to FIG. 6 to FIG. 9. Further, according to an embodiment, the driving transistor TR11 may be formed of a suitable one of the transistor structures described with reference to FIG. 1 to FIG. 5.

The switching transistor TR12 includes a gate electrode connected to the first gate line SLn, a first electrode connected to the data line DLm, and a second electrode connected to the second node N12. The switching transistor TR12 is connected to between the data line DLm and the driving transistor TR11, and is turned on according to the first gate signal having the gate-on voltage applied to the first gate line SLn to transmit the data voltage Vdat applied to the data line DLm to the second node N12. The switching transistor TR12 may further include a gate contact overlapping layer MG connected to the gate electrode. The gate contact overlapping layer MG of the switching transistor TR12 overlaps with the channel region of the switching transistor TR12. The gate contact overlapping layer MG of the switching transistor TR12 may be electrically connected to the first gate line SLn. The switching transistor TR12 may be formed of the transistor structure illustrated in FIG. 12.

The compensation transistor TR13 includes a first compensation transistor TR13-1 and a second compensation transistor TR13-2. The first compensation transistor TR13-1 includes a gate electrode connected to the first gate line SLn, a first electrode connected to a second electrode of the second compensation transistor TR13-2, and a second electrode connected to the first node N11. The second compensation transistor TR13-2 includes a gate electrode connected to the first gate line SLn, a first electrode connected to the third node N13, and the second electrode connected to the first electrode of the first compensation transistor TR13-1. The first compensation transistor TR13-1 and the second compensation transistor TR13-2 are connected between the second electrode and the gate electrode of the driving transistor TR11, and are turned on according to the first gate signal having the gate-on voltage applied to the first gate line SLn. The first compensation transistor TR13-1 and the second compensation transistor TR13-2 may diode-connect the driving transistor TR11 to compensate for the threshold voltage of the driving transistor TR11. Each of first compensation transistor TR13-1 and the second compensation transistor TR13-2 may further include a gate contact overlapping layer MG. Each gate contact overlapping layer MG of the first compensation transistor TR13-1 and the second compensation transistor TR13-2 may be electrically connected to the first gate line SLn. Each gate contact overlapping layer MG of the first compensation transistor TR13-1 and the second compensation transistor TR13-2 overlaps with each channel region of the first compensation transistor TR13-1 and the second compensation transistor TR13-2. The first compensation transistor TR13-1 and the second compensation transistor TR13-2 may be formed of the transistor structure illustrated in FIG. 12. In FIG. 14, it is illustrated that the compensation transistor TR13 incudes the first compensation transistor TR13-1 and the second compensation transistor TR13-2, however the present disclosure is not limited thereto, and according to an embodiment, the compensation transistor TR13 may be formed as one transistor.

The first light emission control transistor TR14 includes a gate electrode connected to the light emission control line ELn, a first electrode connected to the first power source voltage ELVDD, and a second electrode connected to the second node N12. The first light emission control transistor TR14 is connected between the first power source voltage ELVDD and the driving transistor TR11, and is turned on according to the light emission control signal having the gate-on voltage applied to the light emission control line ELn to transmit the first power source voltage ELVDD to the driving transistor TR11.

The second light emission control transistor TR15 includes a gate electrode connected to the light emission control line ELn, a first electrode connected to the third node N13, and a second electrode connected to the anode of the light emitting diode LED. The second light emission control transistor TR15 is connected between the driving transistor TR11 and the light emitting diode LED, and is turned on according to the light emission control signal having the gate-on voltage applied to the light emission control line ELn to transmit the current flowing through the driving transistor TR11 to the light emitting diode LED.

The initialization transistor TR16 includes a first initialization transistor TR16-1 and a second initialization transistor TR16-2. The first initialization transistor TR16-1 includes a gate electrode connected to the second gate line SLIn, a first electrode connected to a second electrode of the second initialization transistor TR16-2, and a second electrode connected to the first node N11. The second initialization transistor TR16-2 includes a gate electrode connected to the second gate line SLIn, a first electrode connected to the initialization voltage Vint, and the second electrode connected to the first electrode of the first initialization transistor TR16-1. The first initialization transistor TR16-1 and the second initialization transistor TR16-2 are connected between the gate electrode of the driving transistor TR11 and the initialization voltage Vint, and are turned on according to the second gate signal having the gate-on voltage applied to the second gate line SLIn to transmit the initialization voltage Vint to the first node N11, thereby initializing the gate voltage of the driving transistor TR11 to the initialization voltage Vint. Each of the first initialization transistor TR16-1 and the second initialization transistor TR16-2 may further include a gate contact overlapping layer MG connected to the gate electrode thereof. Each gate contact overlapping layer MG of the first initialization transistor TR16-1 and the second initialization transistor TR16-2 may be electrically connected to the second gate line SLIn. Each gate contact overlapping layer MG of the first initialization transistor TR16-1 and the second initialization transistor TR16-2 overlaps with each channel region of the first initialization transistor TR16-1 and the second initialization transistor TR16-2. The first initialization transistor TR16-1 and the second initialization transistor TR16-2 may be formed of the transistor structure illustrated in FIG. 12. FIG. 14 shows that the initialization transistor TR16 includes the first initialization transistor TR16-1 and the second initialization transistor TR16-2, but the present disclosure is not limited thereto, and according to an embodiment, the initialization transistor TR16 may be formed as one transistor.

The reset transistor TR17 includes a gate electrode connected to the third gate line SLBn, a first electrode connected to the initialization voltage Vint, and a second electrode connected to the anode of the light emitting diode LED. The reset transistor TR17 is connected between the anode of the light emitting diode LED and the initialization voltage Vint, and is turned on by the third gate signal having the gate-on voltage applied to the third gate line SLBn. The reset transistor TR17 may transmit the initialization voltage Vint to the anode of the light emitting diode LED to reset the light emitting diode LED to the initialization voltage Vint. However, the present disclosure is not limited thereto, and according to an embodiment, the reset transistor TR17 may be omitted.

The driving transistor TR11, the switching transistor TR12, the compensation transistor TR13, the first light emission control transistor TR14, the second light emission control transistor TR15, the initialization transistor TR16, and the reset transistor TR17 may each be a p-channel electric field effect transistor. The gate-on voltage to turn on the p-channel electric field effect transistor is a low level voltage, and the gate-off voltage to turn off the p-channel electric field effect transistor is a high level voltage.

According to an embodiment, at least one of the driving transistor TR11, the switching transistor TR12, the compensation transistor TR13, the first light emission control transistor TR14, the second light emission control transistor TR15, the initialization transistor TR16, and the reset transistor TR17 may be an n-channel electric field effect transistor. The gate-on voltage to turn on the n-channel electric field effect transistor is a high level voltage, and the gate-off voltage to turn off the n-channel electric field effect transistor is a low level voltage.

The storage capacitor Cst includes a first electrode connected to the first power source voltage ELVDD, and a second electrode connected to the first node N11. The data voltage of which the threshold voltage of the driving transistor TR11 is compensated for is transmitted to the first node N11, and the storage capacitor Cst serves to maintain or substantially maintain the voltage of the first node N11.

The light emitting diode LED includes the anode connected to the second electrode of the second light emission control transistor TR15, and the cathode connected to the second power source voltage ELVSS. The light emitting diode LED is connected between the pixel circuit 10 and the second power source voltage ELVSS, thereby emitting light with a luminance corresponding to the current supplied from the pixel circuit 10. The light emitting diode LED may include an emission layer including at least one of an organic light emitting material and/or an inorganic light emitting material. Holes and electrons are injected into the organic emission layer from the anode and the cathode, and emission of light from the organic emission layer occurs when excitons being combinations of the injected holes and electrons drop from an excited state to a ground state. The light emitting diode LED may emit light having a suitable one from among various primary colors, or may emit white light. For example, the primary colors may be three primary colors of red, green, and blue. Another example of the primary colors may be yellow, cyan, magenta, and/or the like.

The structure of the display device including the pixel in which the driving transistor TR11 is formed of the transistor structure illustrated in FIG. 6 and FIG. 7 is now described in more detail with reference to FIG. 15.

Figure 15:
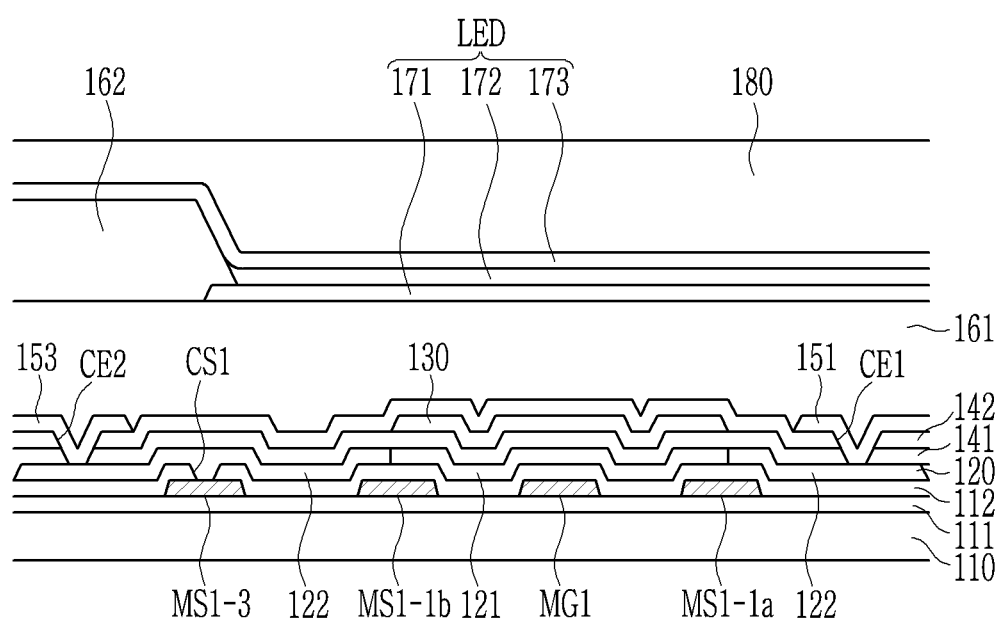
FIG. 15 is a cross-sectional view showing a structure of a display device according to an embodiment of the present disclosure.

FIG. 15 is a cross-sectional view showing a structure of a display device according to an embodiment of the present disclosure.

Referring to FIG. 15, an organic layer 161 may be positioned on the first electrode 151, the second electrode 153, and the second gate insulating layer 142.

A pixel electrode 171 may be disposed on the organic layer 161, and the pixel electrode 171 may be electrically connected to the first electrode 151 of the driving transistor TR11 through a contact hole penetrating the organic layer 161. In other words, the first electrode 151 of the driving transistor TR11 may be electrically connected to the light emitting diode LED through the second light emission control transistor TR15, and in this case, the pixel electrode 171 (e.g., the anode) of the light emitting diode LED may be connected to the second electrode of the second light emission control transistor TR15 through the contact hole of the organic layer 161.

An emission layer 172 is positioned on the pixel electrode 171, and a power source electrode 173 is disposed on the emission layer 172. The power source electrode 173 may be formed of a transparent conductor, for example, such as ITO, IZO, and/or the like. The pixel electrode 171, the emission layer 172, and the power source electrode 173 form the light emitting diode LED.

A definition layer 162 for defining a region of the light emitting diode LED may be disposed around (e.g., to surround around a periphery of) the pixel electrode 171. An encapsulation layer 180 for protecting the light emitting diode LED may be positioned on the light emitting diode LED. The encapsulation layer 180 may be formed of an inorganic layer and an organic layer that are alternately stacked on one another. According to an embodiment, the encapsulation layer 180 may be provided with an encapsulation member, for example, such as transparent glass or plastic, and the encapsulation member may be attached (e.g., may be bonded) to the insulation substrate 110 with a sealant, thereby sealing an internal space and protecting the light emitting diode LED.

Because the features of the embodiment described above with reference to FIG. 6 and FIG. 7 may all be applied to the embodiment described with reference to FIG. 15, redundant description thereof may not be repeated.

A driving method of the display device including the pixel according to the embodiment shown in FIG. 14 is now described with reference to FIG. 16, and a characteristic of the transistor according to an embodiment of the present disclosure is now described in more detail with reference to FIG. 17 and FIG. 18.

Figure 16:
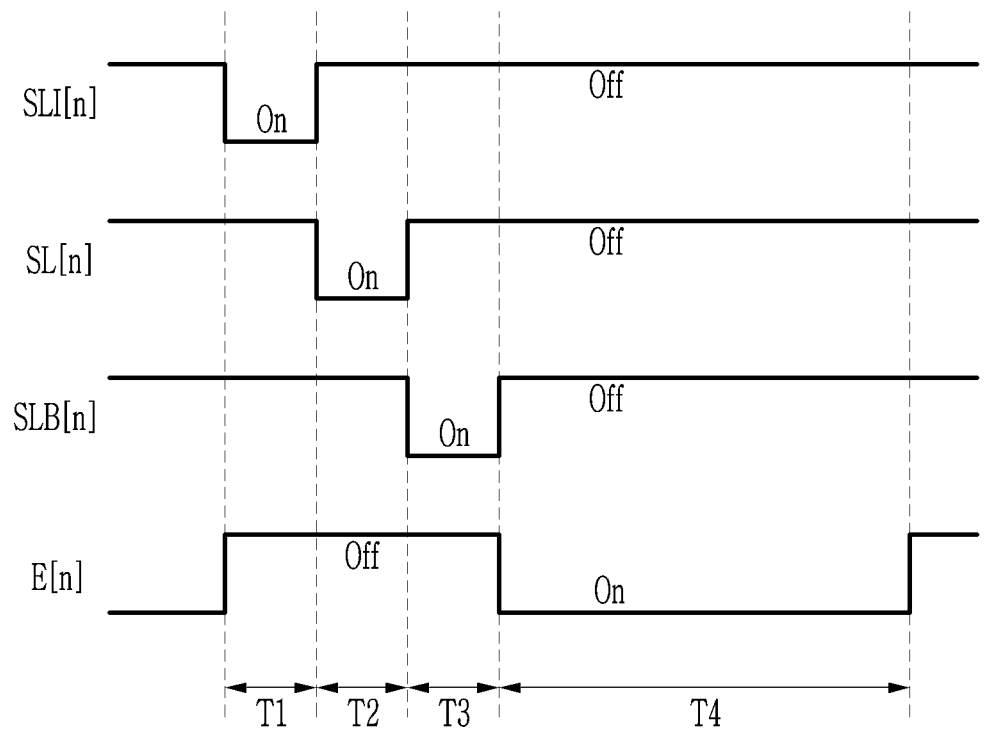
FIG. 16 is a timing diagram showing a driving method of a display device according to an embodiment.

FIG. 16 is a timing diagram showing a driving method of a display device according to an embodiment. FIG. 17 is a graph showing a characteristic of a transistor according to an embodiment of the present disclosure. FIG. 18 is a circuit diagram showing a pixel according to an embodiment.

Figure 17:
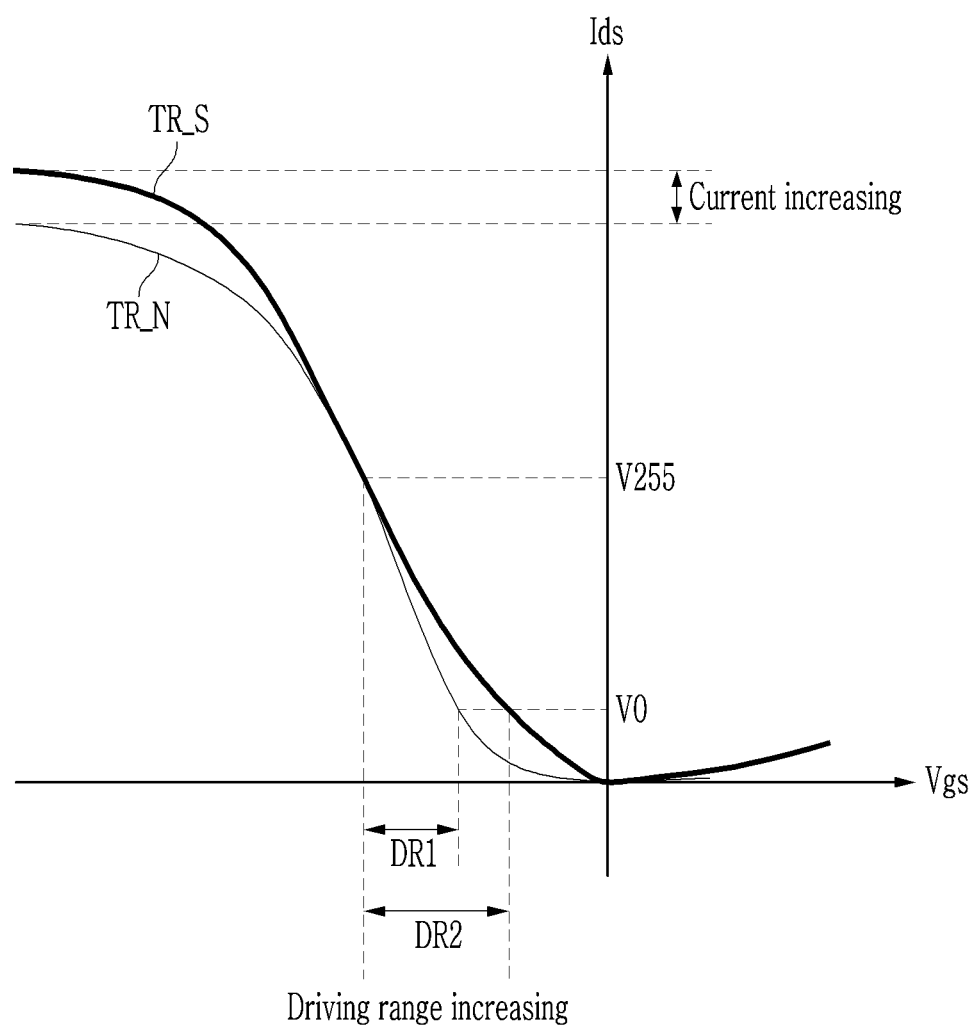
FIG. 17 is a graph showing a characteristic of a transistor according to an embodiment of the present disclosure.
Figure 18:
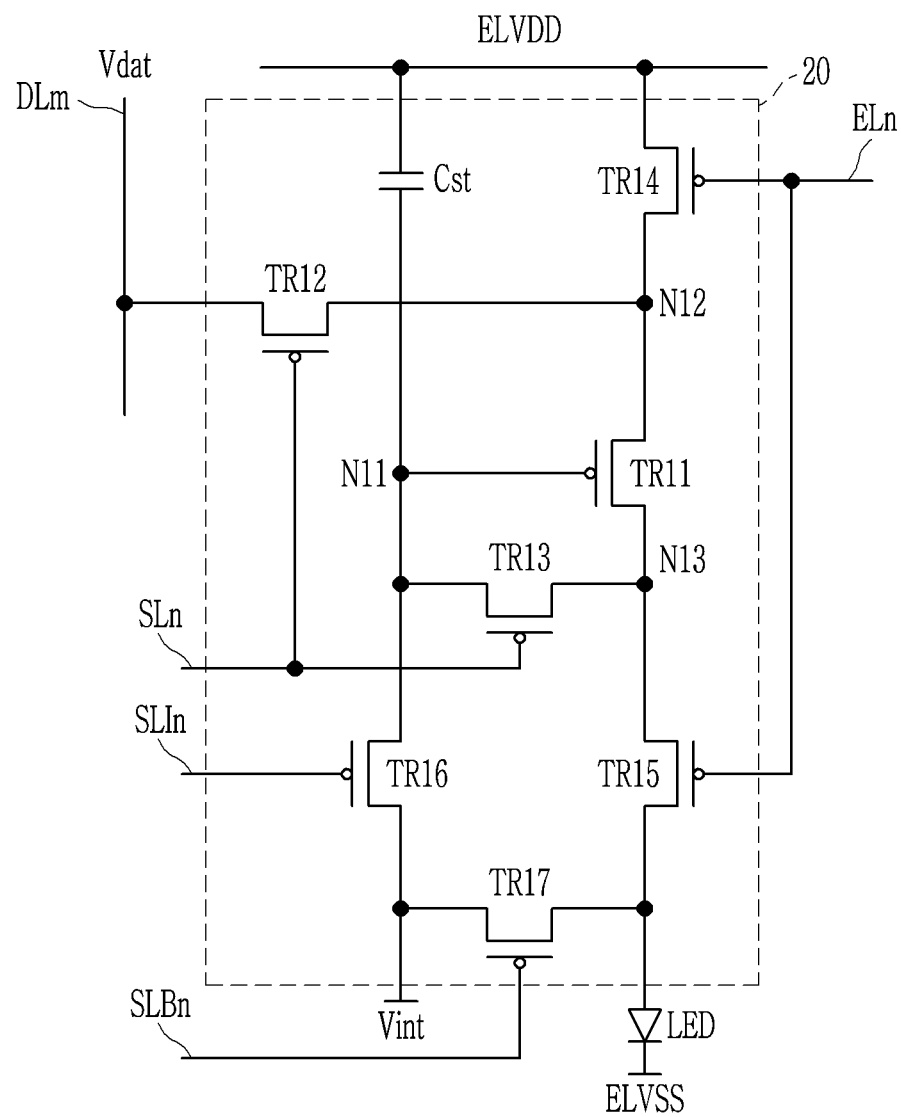
FIG. 18 is a circuit diagram showing a pixel according to an embodiment of the present disclosure.

Referring to FIG. 16 and FIG. 17, the driving method of the display device according to an embodiment may include an initialization period T1, a data writing period T2, a reset period T3, and a light emission period T4.

During the initialization period T1, a second gate signal SLI[n] is applied as a gate-on voltage On. In this case, a first gate signal SL[n], a third gate signal SLB[n], and a light emission control signal E[n] are applied as gate-off voltages Off. The first initialization transistor TR16-1 and the second initialization transistor TR16-2 are turned by the second gate signal SLI[n] having the gate-on voltage On, and the initialization voltage Vint is transferred to the first node N11. The gate voltage of the driving transistor TR11 may be initialized by the initialization voltage Vint.

Each of the first initialization transistor TR16-1 and the second initialization transistor TR16-2 includes the gate contact overlapping layer MG. The second gate signal SLI[n] is applied to each gate contact overlapping layer MG of the first initialization transistor TR16-1 and the second initialization transistor TR16-2. Accordingly, when the first initialization transistor TR16-1 and the second initialization transistor TR16-2 are completely turned on, a current flowing through the first initialization transistor TR16-1 and the second initialization transistor TR16-2 increases. This is described in more detail below with reference to FIG. 17 and FIG. 18.

FIG. 17 is a graph showing a characteristic curve of a general transistor (e.g., a related example transistor) TR_N and a transistor TR_S including the gate contact overlapping layer MG and the semiconductor contact overlapping layer MS1 according to an embodiment of the present disclosure. The pixel circuit 20 including the general transistor TR_N is the same or substantially the same as that of the pixel circuit 20 shown in FIG. 18. In the pixel circuit 20 of FIG. 18, compared with the pixel circuit 10 of FIG. 14, all of the transistors included in the pixel circuit 20 have the structure of the general transistor TR_N without the gate contact overlapping layer MG and the semiconductor contact overlapping layer MS1 described above with reference to FIG. 14.

In FIG. 17, a horizontal axis represents a gate-source voltage difference Vgs of the transistor, and a vertical axis represents a current Ids flowing to the transistor.

Because the gate contact overlapping layer MG is included in the transistor TR_S according to one or more embodiments of the present disclosure, the current flowing to the transistor TR_S according to an embodiment of the present disclosure for the gate-source voltage difference Vgs at which the transistor is completely turned on increases more than the current flowing through the general transistor TR_N. The phrase "the gate-source voltage difference Vgs at which the transistor is completely turned on" may refer to the gate-source voltage difference Vgs at which the transistor may flow the maximum current. In other words, the voltage that is used to increase the current through the transistor TR_S according to the present embodiment is lower than the voltage used to increase the current through the general transistor TR_N.

In other words, referring again to FIG. 16, as each of the first initialization transistor TR16-1 and the second initialization transistor TR16-2 includes the gate contact overlapping layer MG, the current flowing through the first initialization transistor TR16-1 and the second initialization transistor TR16-2 increases in a state in which the first initialization transistor TR16-1 and the second initialization transistor TR16-2 are completely turned on.

During the data writing period T2, the first gate signal SL[n] is applied as having the gate-on voltage On. In this case, the second gate signal SLI[n], the third gate signal SLB[n], and the light emission control signal E[n] are applied as having the gate-off voltage Off. The switching transistor TR12, the first compensation transistor TR13-1, and the second compensation transistor TR13-2 are turned on by the first gate signal SL[n] having the gate-on voltage On. The data voltage Vdat is transmitted to the second node N12 through the turned on switching transistor TR12. As the first compensation transistor TR13-1 and the second compensation transistor TR13-2 are turned on, the driving transistor TR11 is diode-connected, and the data voltage in which the threshold voltage of the driving transistor TR11 is compensated for is transmitted to the first node N11. The voltage transmitted to the first node N11 may be charged to the storage capacitor Cst.

The switching transistor TR12 includes the gate contact overlapping layer MG, and the first gate signal SL[n] is applied to the gate contact overlapping layer MG of the switching transistor TR12. As the switching transistor TR12 includes the gate contact overlapping layer MG, the current flowing through switching transistor TR12 increases when the switching transistor TR12 is completely turned on. Also, each of the first compensation transistor TR13-1 and the second compensation transistor TR13-2 includes the gate contact overlapping layer MG, and the first gate signal SL[n] is applied to each gate contact overlapping layer MG of the first compensation transistor TR13-1 and the second compensation transistor TR13-2. As each of the first compensation transistor TR13-1 and the second compensation transistor TR13-2 includes the gate contact overlapping layer MG, the current flowing through the first compensation transistor TR13-1 and the second compensation transistor TR13-2 increases in a state in which the first compensation transistor TR13-1 and the second compensation transistor TR13-2 are completely turned on. In addition, as the driving transistor TR11 includes the gate contact overlapping layer MG, the current flowing through the driving transistor TR11 may also increase.

The data voltage Vdat applied to the data line DLm may be transmitted to the first node N11 more quickly through the switching transistor TR12, the first compensation transistor TR13-1, and the second compensation transistor TR13-2, and the data voltage in which the threshold voltage of the driving transistor TR11 is compensated for may be charged more quickly to the storage capacitor Cst.

During the reset period T3, the third gate signal SLB[n] having the gate-on voltage On is applied to the third gate line SLBn. In this case, the first gate signal SL[n] applied to the first gate line SLn, the second gate signal SLI[n] applied to the second gate line SLIn, and the light emission control signal E[n] applied to the light emission control line ELn are applied as having the gate-off voltage Off. The reset transistor TR17 is turned on by the third gate signal SLB[n] having the gate-on voltage On, and the initialization voltage Vint is transmitted to the anode of the light emitting diode LED. The light emitting diode LED may be reset by the initialization voltage Vint.

During the light emission period T4, the light emission control signal E[n] is applied as having the gate-on voltage On. In this case, the first gate signal SL[n], the second gate signal SLI[n], and the third gate signal SLB[n] are applied as having the gate-off voltage Off. The first light emission control transistor TR14 and the second light emission control transistor TR15 are turned on by the light emission control signal E[n] having the gate-on voltage On. The first power source voltage ELVDD is transmitted to the second node N12 through the turned on first light emission control transistor TR14 and the driving transistor TR11, and the light emitting diode LED may be electrically connected by the turned on second light emission control transistor TR15. The current corresponding to the voltage of the first node N11 flows from the first power source voltage ELVDD to the light emitting diode LED through the driving transistor TR11, and the light emitting diode LED may be emitted with a luminance corresponding to the current (e.g., an amount of the current). In this case, the voltage of the first node N11 is applied to the gate contact overlapping layer MG of the driving transistor TR11 connected to the first node N11. Also, the first power source voltage ELVDD is applied to the semiconductor contact overlapping layer MS1 of the driving transistor TR11 connected to the second node N12. As the driving transistor TR11 includes the semiconductor contact overlapping layer MS1, the data range of the driving transistor TR11 increases. This is described in more detail below with reference to FIG. 17 and FIG. 18.

In FIG. 17, V0 and V255 represent positions of a current value representing a minimum gray (e.g., a 0 gray level) and a current value representing a maximum gray (e.g., a 255 gray level) based on 256 grays (e.g., 256 gray levels). As the semiconductor contact overlapping layer MS1 is included in the transistor TR_S according to one or more embodiments of the present disclosure, the slope of the characteristic curve of the transistor TR_S changes more gently (e.g., more gradually) than that of the characteristic curve of the general transistor TR_N (e.g., the transistor included in the pixel circuit 20 of FIG. 18) as the gate-source voltage difference Vgs increases in the range displaying the corresponding gray level. Accordingly, the data range DR2 of the transistor TR_S according to the present embodiment becomes larger than the data range DR1 of the general transistor TR_N. The data range is an interval between the gate-source voltage difference Vgs to provide the current value representing the minimum gray and the gate-source voltage difference Vgs to provide the current value representing the maximum gray. In other words, the driving range in which the transistor TR_S according to the present embodiment is driven to display the minimum gray and the maximum gray is increased.

As described above, as the data range of the driving transistor TR11 increases, the output of the driving transistor TR11 is changed less sensitively to the change of the gate-source voltage difference Vgs, and as a result, the change in the output according to the characteristic included in the driving transistor TR11 also becomes less sensitive. Accordingly, the change in the characteristic between a plurality of pixels PX that emit light in the light emission period T4 is reduced, so that the display quality may be uniform or substantially uniform, and thus, the display quality may be improved. In addition, as the data range of the driving transistor TR11 increases, images of more various grays (e.g., more various gray levels) may be displayed.

The above detailed description with reference to the accompanying drawings are provided to assist in a comprehensive understanding of the example embodiments of the present disclosure presented herein. It includes various specific details to assist in that understanding, but are to be regarded as merely examples. Accordingly, those of ordinary skill in the art will recognize that various changes and modifications to the example embodiments described herein may be made, without departing from the spirit and scope and spirit of the present disclosure as defined in the appended claims, and their equivalents.

DESCRIPTION OF SYMBOLS

110: substrate
120: semiconductor layer
130: gate electrode
ML: overlapping layer

The invention claimed is:

1. A display device, comprising:
a substrate; and
a transistor on the substrate,
wherein the transistor comprises:
a semiconductor layer;
a gate electrode overlapping with the semiconductor layer;
a first gate contact overlapping layer overlapping with a channel region, and in contact with the gate electrode, the channel region being a region where the gate electrode and the semiconductor layer are overlapped with each other; and
a semiconductor contact overlapping layer overlapping with the channel region, and in direct contact with the semiconductor layer, and
wherein the first gate contact overlapping layer and the semiconductor contact overlapping layer are spaced apart from each other by a gap within the channel region.

2. The display device of claim 1, wherein the transistor further comprises:
a second gate contact overlapping layer overlapping with the channel region, and in contact with the gate electrode, and
wherein the semiconductor contact overlapping layer is between the first gate contact overlapping layer and the second gate contact overlapping layer in a plan view.

3. The display device of claim 2, wherein, in the plan view, a width of an entire region including the first gate contact overlapping layer, the semiconductor contact overlapping layer, the second gate contact overlapping layer, and the gap is larger than a width of the channel region.

4. The display device of claim 2, wherein in a plan view, a width of an entire region including the first gate contact overlapping layer, the semiconductor contact overlapping layer, the second gate contact overlapping layer, and the gap is smaller than a width of the channel region.

5. The display device of claim 2, wherein the transistor further comprises a floating overlapping layer overlapping with the channel region, and insulated from the semiconductor layer and the gate electrode without being connected to the semiconductor layer and the gate electrode.

6. The display device of claim 1, wherein the semiconductor contact overlapping layer comprises:
a first overlapping part overlapping with the channel region;
a second overlapping part overlapping with the channel region;
a contact portion in contact with the semiconductor layer without overlapping with the gate electrode; and
an extending part connecting the first overlapping part, the second overlapping part, and the contact portion to each other.

7. The display device of claim 6, wherein the first gate contact overlapping layer is between the first overlapping part and the second overlapping part.

8. The display device of claim 6, wherein, in a plan view, a width of an entire region including the first gate contact overlapping layer, the first overlapping part, the second overlapping part, and the gap is larger than a width of the channel region.

9. The display device of claim 6, wherein in a plan view, a width of an entire region including the first gate contact overlapping layer, the first overlapping part, the second overlapping part, and the gap is smaller than a width of the channel region.

10. The display device of claim 6, wherein the transistor further comprises a floating overlapping layer overlapping with the channel region, and insulated from the semiconductor layer and the gate electrode without being connected to the semiconductor layer and the gate electrode.

11. The display device of claim 1, wherein a width of the first gate contact overlapping layer is equal to a width of the semiconductor contact overlapping layer.

12. The display device of claim 1, wherein a width of the first gate contact overlapping layer and a width of the semiconductor contact overlapping layer are different from each other.

* * * * *